(12) United States Patent
Lee et al.

(10) Patent No.: US 7,907,449 B2
(45) Date of Patent: Mar. 15, 2011

(54) TWO PASS ERASE FOR NON-VOLATILE STORAGE

(75) Inventors: Dana Lee, Saratoga, CA (US); Nima Mokhlesi, Los Gatos, CA (US); Anubhav Khandelwal, Mountain View, CA (US)

(73) Assignee: SanDisk Corporation, Milpitas, CA (US)

( * ) Notice: Subject to any disclaimer, the term of this patent is extended or adjusted under 35 U.S.C. 154(b) by 98 days.

(21) Appl. No.: 12/421,098

(22) Filed: Apr. 9, 2009

(65) Prior Publication Data

US 2010/0259987 A1   Oct. 14, 2010

(51) Int. Cl.
    G11C 16/06   (2006.01)
(52) U.S. Cl. ............ 365/185.17; 365/185.24; 365/185.3; 365/185.11
(58) Field of Classification Search ............. 365/185.29, 365/185.3, 185.17, 185.24, 185.11
    See application file for complete search history.

(56) References Cited

U.S. PATENT DOCUMENTS

2009/0180325 A1* 7/2009 Ito .............................. 365/185.17

FOREIGN PATENT DOCUMENTS

WO   2009006485 A1   1/2009

OTHER PUBLICATIONS

International Search Report and Written Opinion dated Oct. 27, 2010, PCT Application No. PCT/US2010/029246.

* cited by examiner

*Primary Examiner* — Thong Q Le
(74) *Attorney, Agent, or Firm* — Vierra Magen Marcus & DeNiro LLP

(57) ABSTRACT

Techniques are disclosed herein for erasing non-volatile memory cells. The memory cells are erased using a trial erase pulse. A suitable magnitude for a second pulse is determined based on the magnitude of the trial erase pulse and data collected about the threshold voltage distribution after the trial erase. The second erase pulse is used to erase the memory cells. In one implementation, the threshold voltages of the memory cells are not verified after the second erase. Soft programming after the second erase may be performed. The magnitude of the soft programming pulse may be determined based on the trial erase pulse. In one implementation, the memory cells' threshold voltages are not verified after the soft programming. Limiting the number of erase pulses and soft programming pulses saves time and power. Determining an appropriate magnitude for the second erase pulse minimizes or eliminates over-erasing.

29 Claims, 17 Drawing Sheets

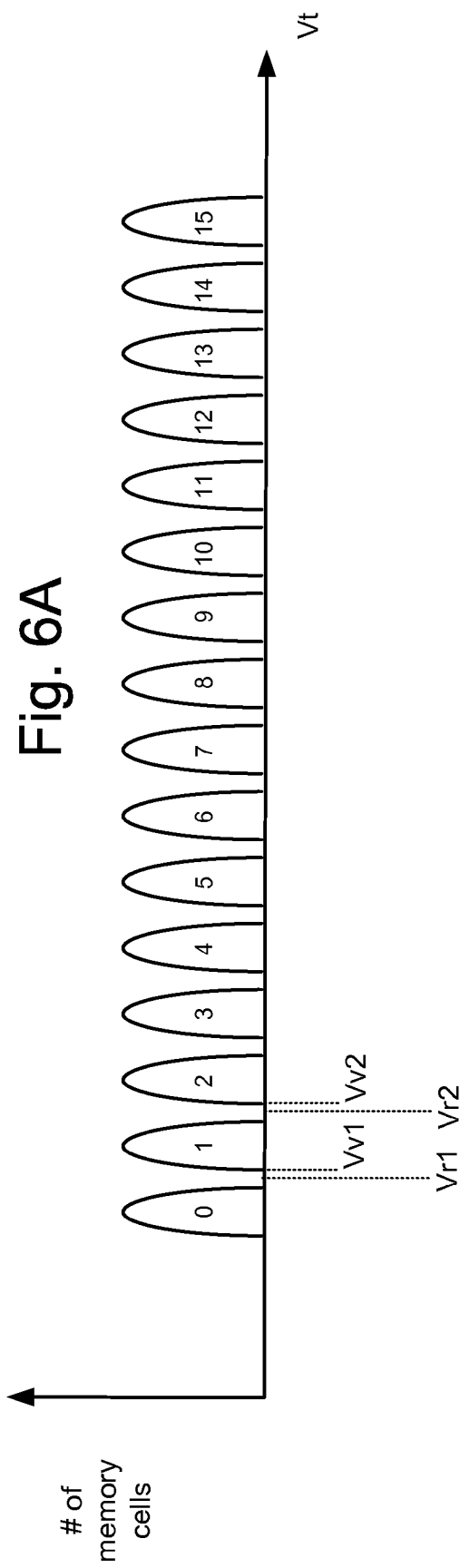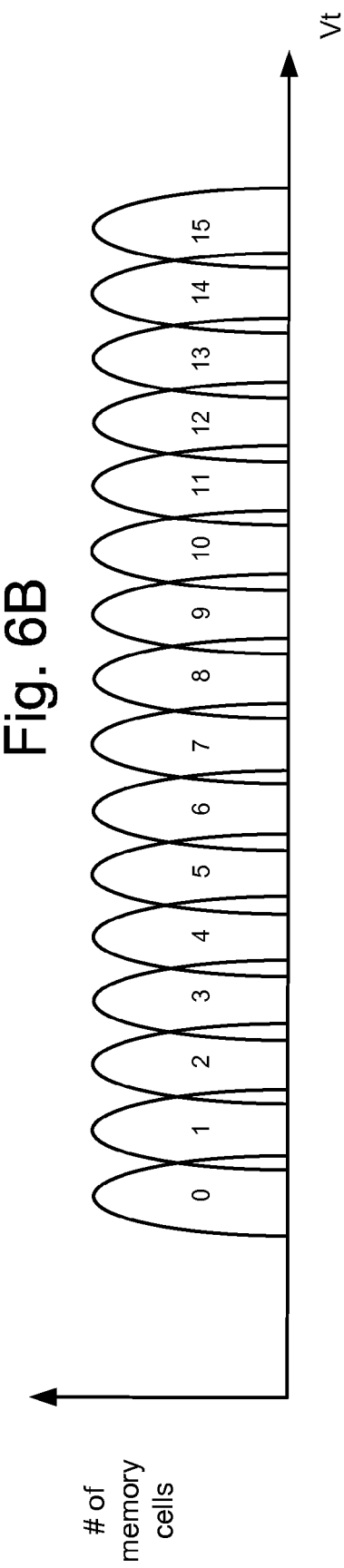
Fig. 6A
Fig. 6B

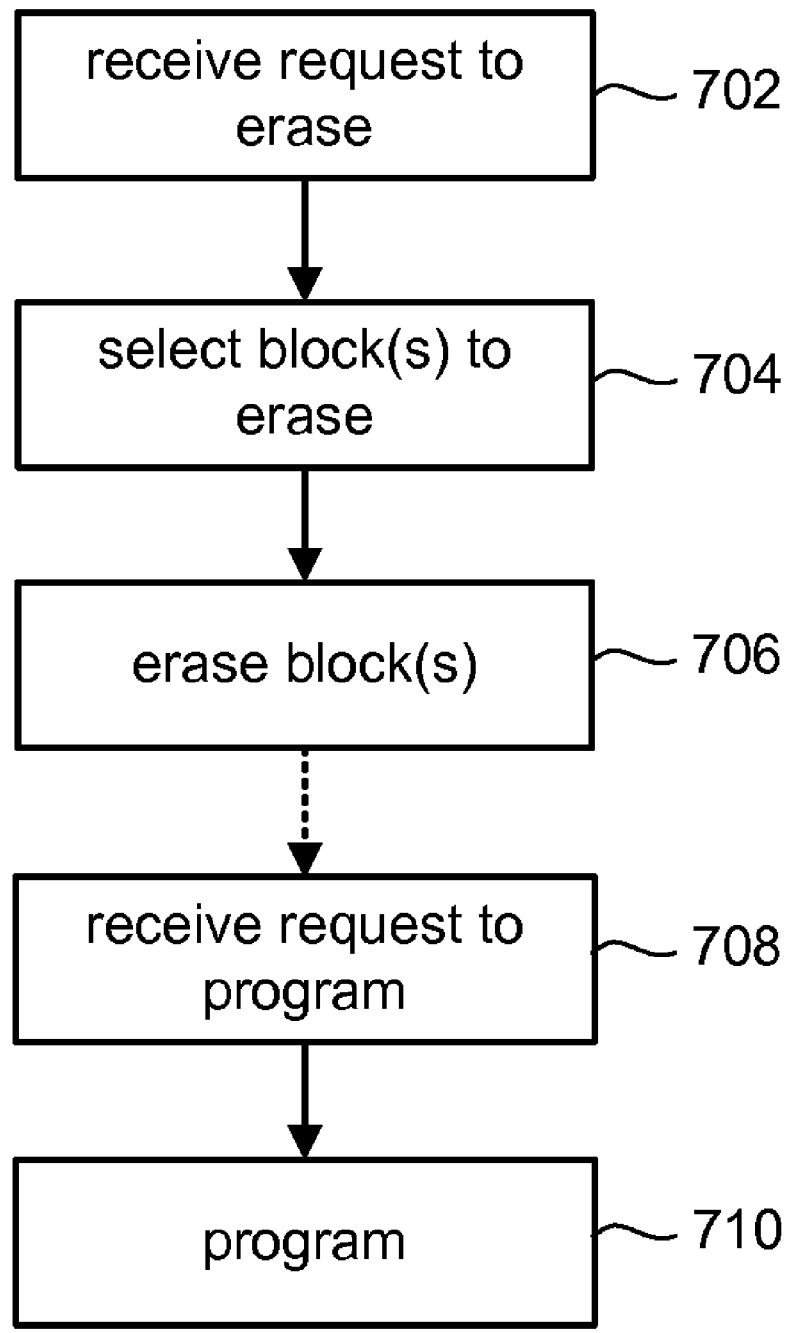

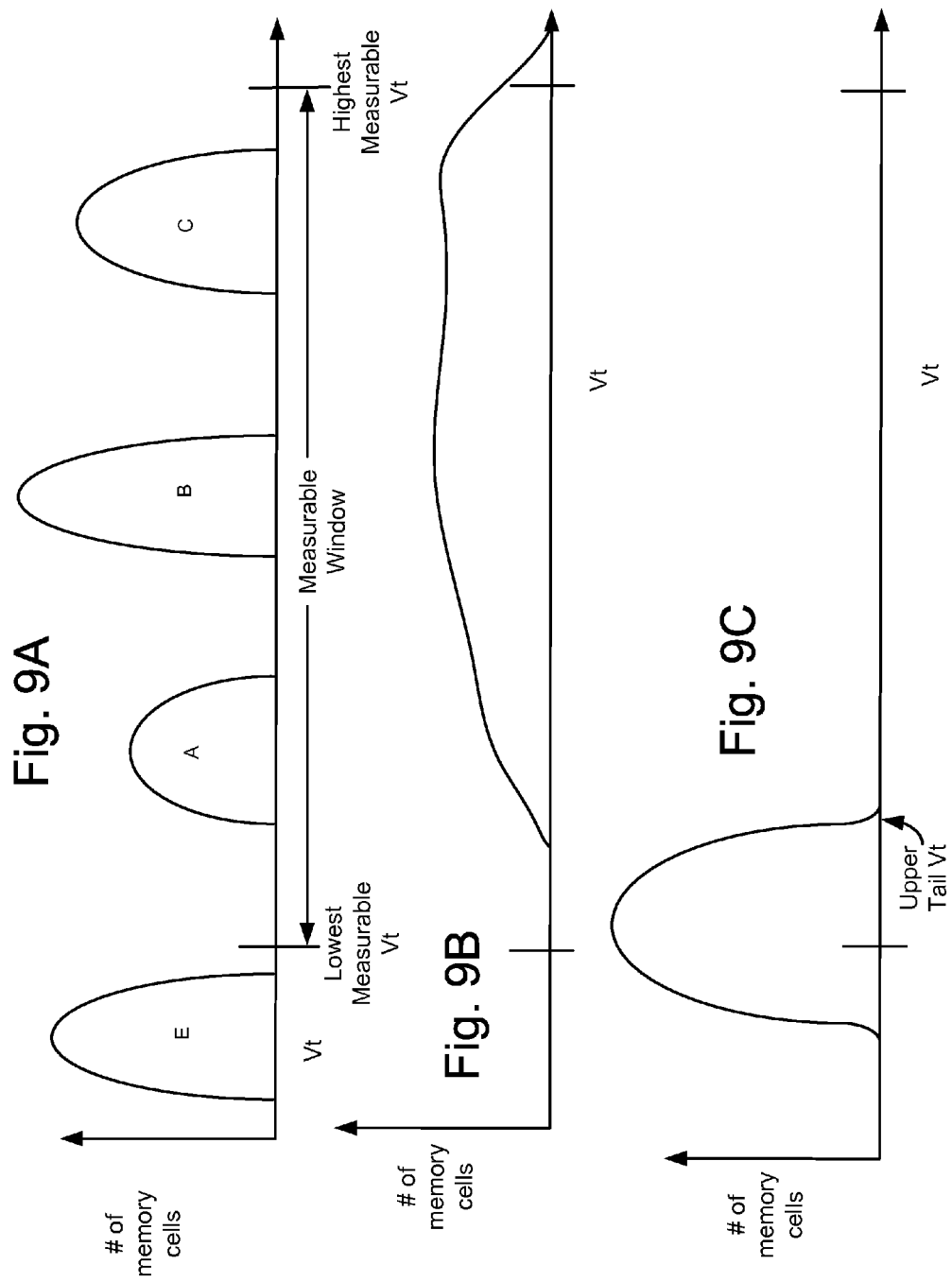

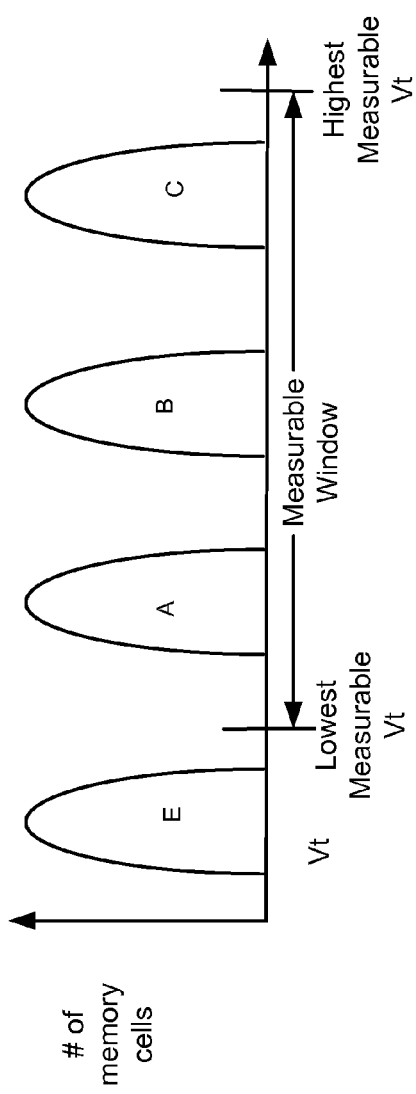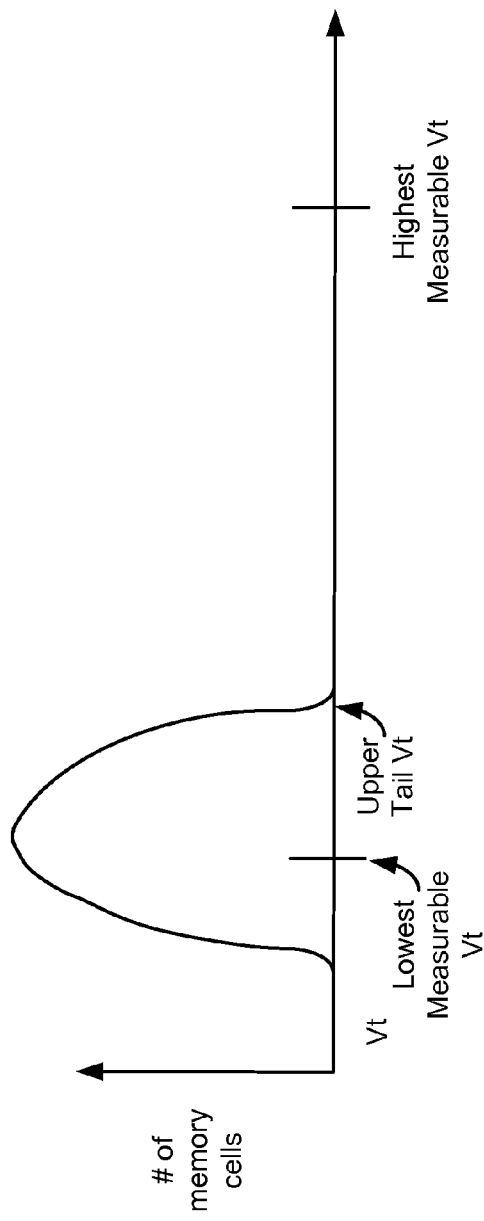

TWO PASS ERASE FOR NON-VOLATILE STORAGE

BACKGROUND OF THE INVENTION

1. Field of the Invention

The present invention relates to technology for non-volatile storage.

2. Description of the Related Art

Semiconductor memory has become more popular for use in various electronic devices. For example, non-volatile semiconductor memory is used in personal navigation devices, cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate and channel regions are positioned between the source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROMs or flash memory devices have a configuration referred to as a NAND configuration in which memory cells are grouped as NAND strings with each NAND string associated with a bit line. When programming an EEPROM or flash memory device, such as a NAND flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in a programmed state. More information about programming can be found in U.S. Pat. Nos. 6,859,397, titled "Source Side Self Boosting Technique for Non-Volatile Memory;" 6,917,542, titled "Detecting Over Programmed Memory;" and 6,888,758, titled "Programming Non-Volatile Memory," all three cited patents are incorporated herein by reference in their entirety.

In many cases, the program voltage is applied to the control gate as a series of pulses (referred to as programming pulses), with the magnitude of the pulses increasing with each pulse. Between programming pulses, a set of one or more verify operations are performed to determine whether the memory cell(s) being programmed have reached their target level. If a memory cell has reached its target level, programming stops for that memory cell. If a memory cell has not reached its target level, programming will continue for that memory cell.

In some implementations, the memory cells are erased prior to programming. Erasing can be performed on the entire memory array, on individual blocks, or another unit of cells. In one implementation, a group of memory cells is erased by raising p-wells of the memory cells to an erase voltage for a sufficient period of time. An erase pulse moves the threshold voltage of the memory cells towards (or beyond) an erase target level, which may be below 0 Volts. In some implementations, after applying the erase pulse, an erase verify operation is performed to determine whether the threshold voltages of the memory cells have at least reached the erase target level. The erase pulse and erase verify are repeated with each loop using a higher amplitude erase pulse until the erase verify passes.

After erasing the memory cells, some memory cells may be over-erased. That is, the threshold voltage of some memory cells is pushed past the target level. For example, the threshold voltage is more negative than desired. Furthermore, the range of threshold voltages of the memory cells may be wider than desired, which can negatively impact the quality of later programming. To tighten the erase distribution and combat over-erasing, the memory cells may be "soft programmed," which compacts the threshold voltage distribution by increasing the lowest threshold voltages of erased memory cells while not significantly increasing the highest threshold voltages of erased memory cells. Soft programming may be performed in a similar manner as the previously described programming, but uses programming pulses with lower voltage magnitudes than regular programming. In one implementation, the soft programming is performed in loops in which each successively higher amplitude soft program pulse is followed by a soft program verify operation.

The process of erasing the memory cells and verifying the erase has drawbacks including the amount of time taken and power consumed. In some implementations, each of the erase pulses biases up substantial portions of the memory device. Therefore, ramping up to the final erase voltage takes considerable time. For example, it may take hundreds of microseconds to ramp up to the final erase voltage. Furthermore, because this high voltage pulse is applied over a long duration, considerable power is consumed.

In some cases, the target level that needs to be verified by the erase verify or the soft programming verify is a negative value. In one implementation, negative threshold voltages are sensed by pre-discharging bit lines to ground and then applying a higher than zero voltage (e.g., 2.2V) to the common source line. This causes current to flow from the source to the bit lines causing the bit lines to charge up towards the source line voltage. Charging of the bit lines stops when the body effect turns off at least one of the memory cells in a NAND chain. Using this technique, negative threshold voltages approaching −Vdd multiplied by the body effect factor (e.g., 2.2×1.5 where 2.2V is the VDD and 1.5 is the body effect factor) can be measured. However, a single erase verify or soft program verify can take about 100 micro-seconds.

Another technique for sensing a negative threshold voltage in a memory cell is to apply a negative voltage to the control gates of the memory cells. However, generating and/or delivering the necessary negative voltages can be difficult. Moreover, the more negative the voltage to be generated the more difficult it is to generate the voltage. Delivering negative voltages to word lines can be very difficult as it may require more than one type (n-type vs. p-type) of transistor in the decoder. This can lead to very large and expensive world line decoders, or even decoders that cannot match the small pitch of the memory array.

One technique to increase performance is to use fewer erase pulses by using large erase voltage step sizes. For example, rather than stepping up the erase voltage pulse by 0.5 volts with each successive erase pulse, the erase voltage could be stepped by 1.0 volt. However, using large voltage step sizes may lead to over-erasing. In some implementation, using a step size of 1.0 volt could lead to over-erasing some of the memory cells by about 1.0 volt. In one implementation, the erase process is completed with a single very high voltage erase pulse. However, using a single very high magnitude erase pulse can lead to extreme over-erasing.

To correct the over-erasing when using a single erase pulse, a large number of soft programming pulses may be used. In one implementation, about 15-20 soft programming pulses and soft verify operations are used. As each soft programming verify may take about 100 micro-seconds, substantial time can be used during the soft programming.

SUMMARY OF THE INVENTION

Techniques are disclosed herein for erasing non-volatile storage devices. In one implementation, the non-volatile storage devices are erased with a trial erase pulse. Then, a suitable magnitude for a second erase pulse is determined based on the magnitude of the trial erase pulse and data collected about the threshold voltage distribution after the trial erase. The second erase pulse is then used to erase the memory cells. In one implementation, the threshold voltages of the memory cells are not verified after the second erase. Soft programming after the second erase may be performed, but is not required. If soft programming is performed, the magnitude of the soft programming pulse may be determined based on the trial erase pulse. In one implementation, the threshold voltages of the memory cells are not verified after the soft programming. By limiting the number of erase pulses, time and power are saved. Moreover, by determining an appropriate magnitude for the second erase pulse, over-erasing is minimized or eliminated. Furthermore, by limiting the number of soft programming pulses, time and power are saved.

One embodiment includes performing a first erase of a group of non-volatile storage elements with a first erase voltage. After the first erase, the non-volatile storage elements have a threshold voltage distribution. A reference voltage on the threshold voltage distribution is determined. A second erase voltage is determined based on the first erase voltage and the reference voltage. A second erase of the group of non-volatile storage elements is performed with the second erase voltage.

In one embodiment, a soft program voltage is determined based on the second erase voltage. The soft program voltage is applied to the group of non-volatile storage elements after performing the second erase.

One embodiment is a method for operating a non-volatile storage device. The method comprises programming NAND strings of non-volatile storage elements such that substantially all of the non-volatile storage elements have at least a certain threshold voltage. The NAND strings are erased with a first erase voltage, and a voltage on an upper tail of a threshold voltage distribution of the NAND strings is determined after erasing with the first erase voltage. A second erase voltage is determined based on the first erase voltage and the voltage on the upper tail. The NAND strings are erased with the second erase voltage.

One embodiment is a method for operating a non-volatile storage device. The method comprises pre-conditioning a group of non-volatile storage elements to facilitate determining a threshold voltage associated with an upper tail of an erase threshold distribution that the group of non-volatile storage elements will have after erasing the group of non-volatile storage elements. The group of non-volatile storage elements are erased to the erase threshold distribution having the upper tail. The erasing is performed with a first erase voltage after the programming. The threshold voltage associated with the upper tail of the erase threshold distribution is determined. The threshold voltage is defined based on a certain number of the non-volatile storage elements that are allowed to have threshold voltages that are greater than the threshold voltages of the other non-volatile storage elements in the group. A second erase voltage is determined based on the first erase voltage and the threshold voltage associated with the upper tail. The group of non-volatile storage elements is erased with the second erase voltage.

One example implementation includes a group of non-volatile storage elements and one or more managing circuits in communication with the group of non-volatile storage elements. The managing circuit performs a first erase of the group of non-volatile storage elements with a first erase voltage, the non-volatile storage elements have a threshold voltage distribution as a result of the first erase. The managing circuit determines a reference voltage on the threshold voltage distribution. The managing circuit determines a second erase voltage based on the first erase voltage and the reference voltage. The managing circuit performs a second erase of the group of non-volatile storage elements with the second erase voltage.

One embodiment is a non-volatile storage device comprises a plurality of NAND strings of non-volatile storage elements and a managing circuit in communication with the plurality of NAND strings. The managing circuit programs the plurality of NAND strings of non-volatile storage elements such that substantially all of the non-volatile storage elements have at least a certain threshold voltage. The managing circuit erases the plurality of NAND strings of non-volatile storage elements with a first erase voltage. The managing circuit determines a voltage on an upper tail of a threshold voltage distribution of the plurality of NAND strings of non-volatile storage elements after erasing with the first erase voltage. The managing circuit determines a second erase voltage based on the first erase voltage and the voltage on the upper tail. The managing circuit erases the plurality of NAND strings of non-volatile storage elements with the second erase voltage.

BRIEF DESCRIPTION OF THE DRAWINGS

FIG. 6A depicts an example set of Vt distributions.

FIG. 6B depicts an example set of Vt distributions.

FIG. 7 is a flow chart describing one embodiment of a process for erasing and programming memory cells.

FIG. 9A depicts a graph of four Vt distributions of the memory cells prior to applying a programming pulse.

FIG. 9B depicts a graph of a Vt distribution after applying a programming pulse.

FIG. 9C depicts an erase threshold distribution after a trial erase.

FIG. 10A depicts an example of a randomized distribution of data states.

FIG. 10B depicts an example Vt distribution after a trial erase.

DETAILED DESCRIPTION

Figure 1:
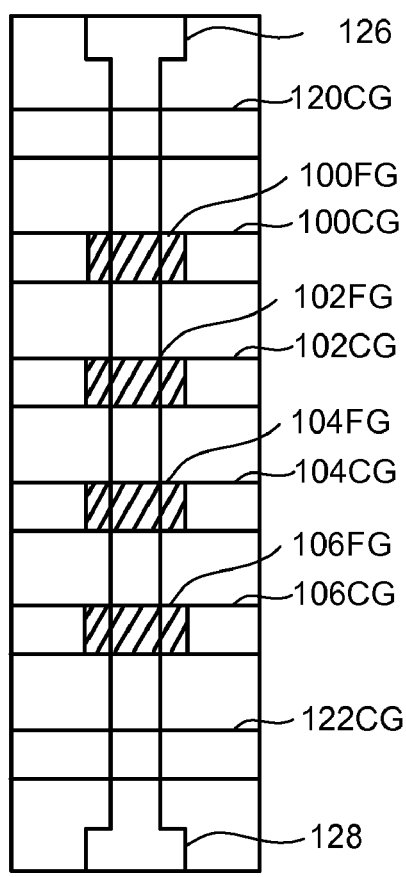
FIG. 1 is a top view of a NAND string.
Figure 2:
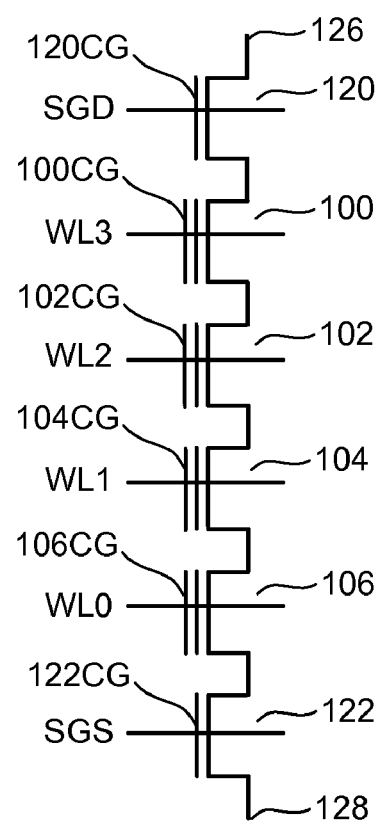
FIG. 2 is an equivalent circuit diagram of the NAND string.

One example of a flash memory system uses the NAND structure, which includes arranging multiple transistors in series, sandwiched between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between a first (or drain side) select gate 120 and a second (or source side) select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four transistors is only provided as an example. A NAND string can have fewer than four memory cells or more than four memory cells. For example, some NAND strings will include eight memory cells, 16 memory cells, 32 memory cells, 64 memory cells, 128 memory cells, etc. The discussion herein is not limited to any particular number of memory cells in a NAND string.

A typical architecture for a flash memory system using a NAND structure will include several NAND strings. Each NAND string is connected to the source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to one or more sense amplifiers.

Each memory cell can store data (analog or digital). When storing one bit of digital data, the range of possible threshold voltages of the memory cell is divided into two ranges which are assigned logical data "1" and "0." In one example of a NAND type flash memory, the threshold voltage is negative after the memory cell is erased, and defined as logic "1." The threshold voltage after programming is positive and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored.

In the case of storing multiple levels of data, the range of possible threshold voltages is divided into the number of levels of data. For example, if four levels of information is stored (two bits of data), there will be four threshold voltage ranges assigned to the data values "11", "10", "01", and "00." In one example of a NAND type memory, the threshold voltage after an erase operation is negative and defined as "11". Positive threshold voltages are used for the data states of "10", "01", and "00." If eight levels of information (or states) are stored (e.g. for three bits of data), there will be eight threshold voltage ranges assigned to the data values "000", "001", "010", "011" "100", "101", "110" and "111."

The specific relationship between the data programmed into the memory cell and the threshold voltage levels of the cell depends upon the data encoding scheme adopted for the cells. For example, U.S. Pat. No. 6,222,762 and U.S. Patent Application Publication No. 2004/0255090, both of which are incorporated herein by reference in their entirety, describe various data encoding schemes for multi-state flash memory cells. In one embodiment, data values are assigned to the threshold voltage ranges using a Gray code assignment so that if the threshold voltage of a floating gate erroneously shifts to its neighboring physical state, only one bit will be affected. In some embodiments, the data encoding scheme can be changed for different word lines, the data encoding scheme can be changed over time, or the data bits for random word lines may be inverted or otherwise randomized to reduce data pattern sensitivity and even wear on the memory cells.

Relevant examples of NAND type flash memories and their operation are provided in the following U.S. Patents/Patent Applications, all of which are incorporated herein by reference: U.S. Pat. Nos. 5,570,315; 5,774,397; 6,046,935; 6,456,528; and U.S. Pat. Publication No. US2003/0002348. The discussion herein can also apply to other types of flash memory in addition to NAND as well as other types of non-volatile memory.

Other types of non-volatile storage devices, in addition to NAND flash memory, can also be used. For example, a so called TANOS structure (consisting of a stacked layer of TaN—$Al_2O_3$—$_{SiN}$—$_{SiO_2}$ on a silicon substrate), which is basically a memory cell using trapping of charge in a nitride layer (instead of a floating gate), can also be used with the present invention. Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The memory cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar memory cell in a split-gate configuration where a doped polysilicon gate extends over a portion of the memory cell channel to form a separate select transistor. The foregoing two articles are incorporated herein by reference in their entirety. The programming techniques mentioned in section 1.2 of "Nonvolatile Semiconductor Memory Technology," edited by William D. Brown and Joe E. Brewer, IEEE Press, 1998, incorporated herein by reference, are also described in that section to be applicable to dielectric charge-trapping devices. Other types of memory devices can also be used.

Figure 3:
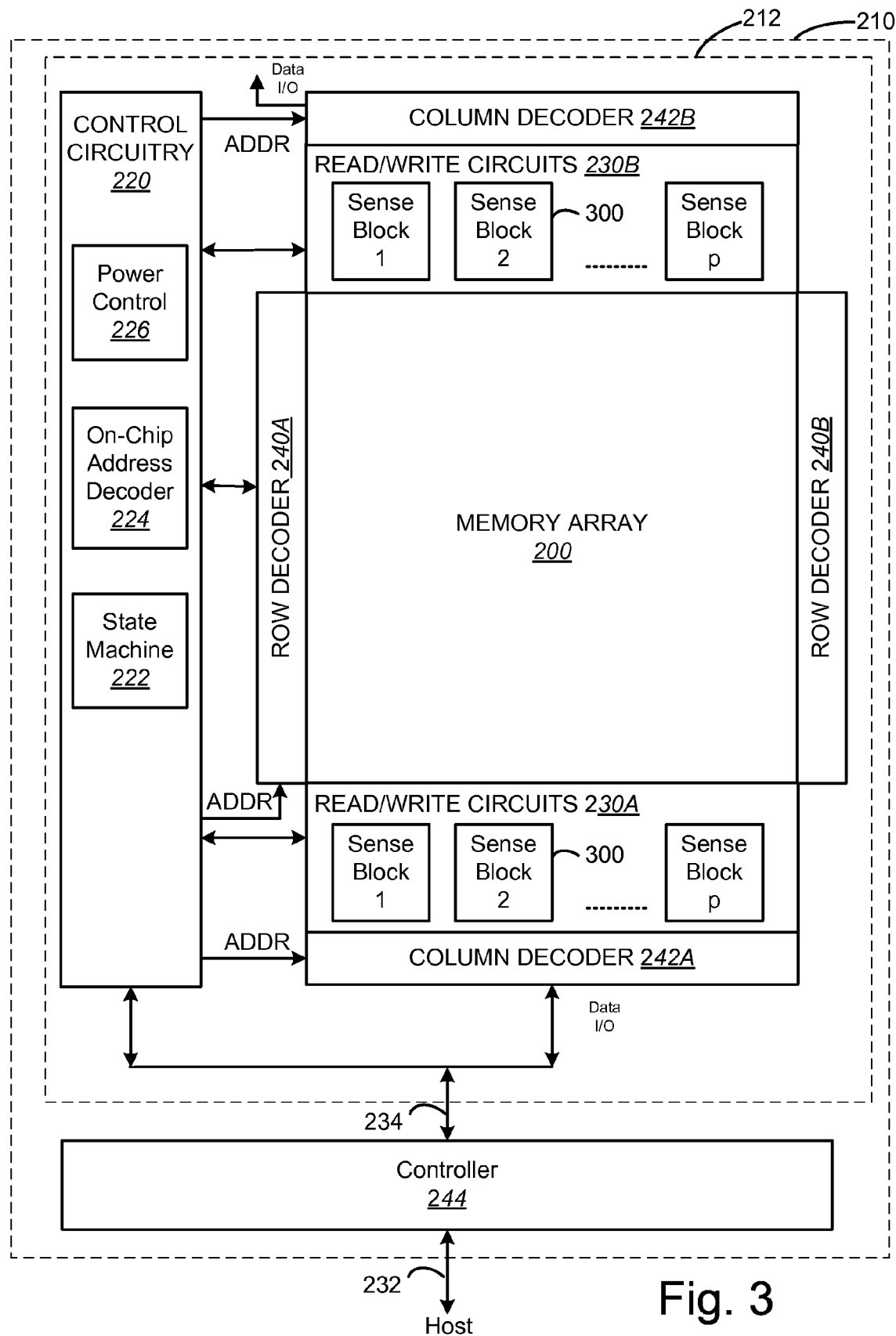
FIG. 3 is a block diagram of a non-volatile memory system.

FIG. 3 illustrates a non-volatile storage device 210 that may include one or more memory die or chips 212. Memory die 212 includes an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 100 is addressable by word lines via row decoders 240A and 240B and by bit lines via column decoders 242A and 242B. In a typical embodiment, a controller 244 is included in the same memory device 210 (e.g., a removable storage card or package) as the one or more memory die 212. Commands and data are transferred between the host and controller 244 via lines 232 and between the controller and the one or more memory die 212 via lines 234. One implementation can include multiple chips 212.

Control circuitry 220 cooperates with the read/write circuits 230A and 230B to perform memory operations on the memory array 200. The control circuitry 220 includes a state machine 222, an on-chip address decoder 224 and a power control module 226. The state machine 222 provides chip-level control of memory operations. The on-chip address decoder 224 provides an address interface to convert between the address that is used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage.

In one embodiment, one or any combination of control circuitry 220, power control circuit 226, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits.

Figure 4:
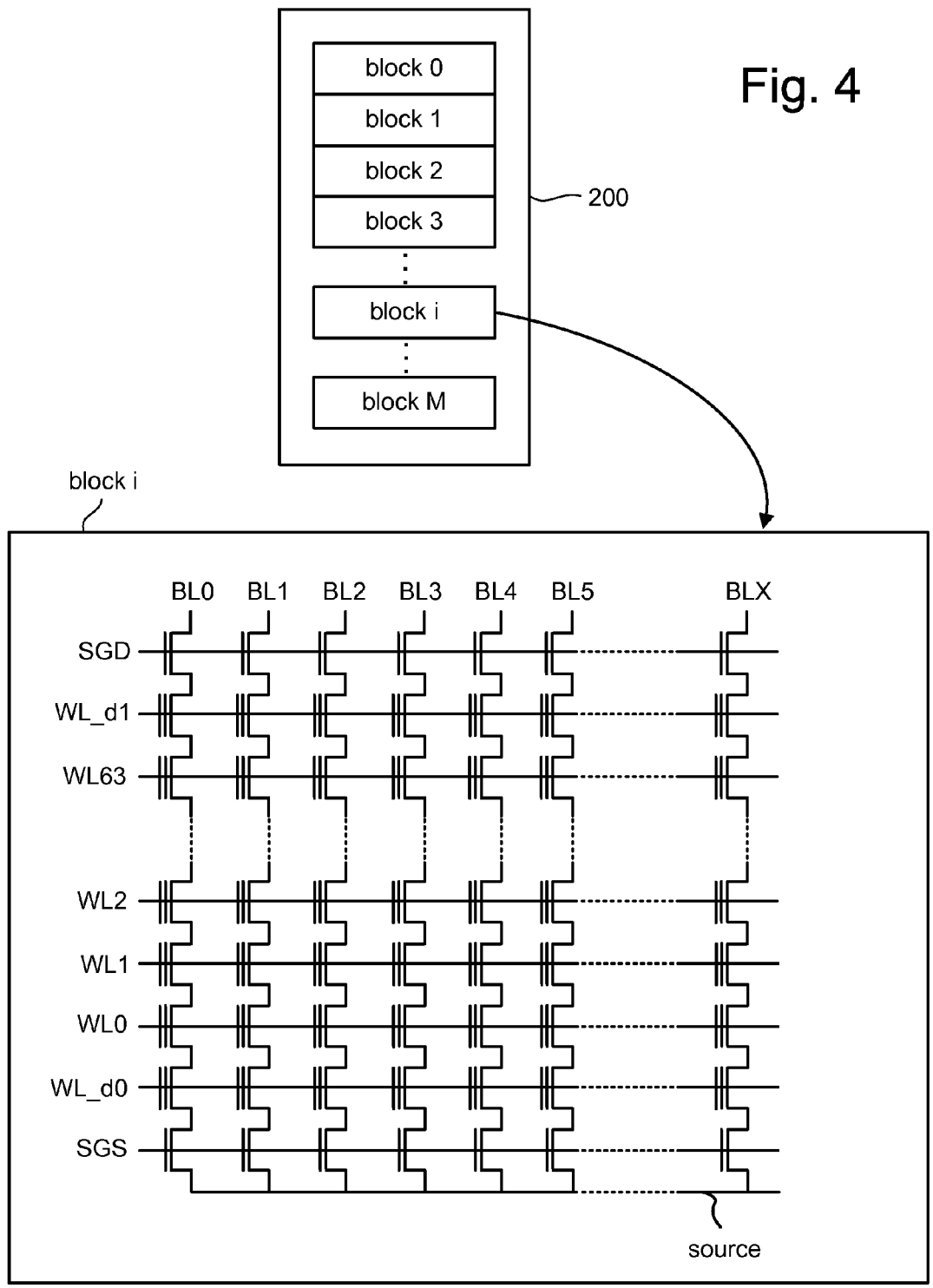
FIG. 4 is a block diagram depicting one embodiment of a memory array.

FIG. 4 depicts an exemplary structure of memory cell array 200. In one embodiment, the array of memory cells is divided into M blocks of memory cells. As is common for flash EEPROM systems, the block is the unit of erase. That is, each block contains the minimum number of memory cells that are erased together. Each block is typically divided into a number of pages. A page is a unit of programming. One or more pages of data are typically stored in one row of memory cells. A page can store one or more sectors. A sector includes user data and overhead data. Overhead data typically includes an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks and arrangements can also be used.

In another embodiment, the bit lines are divided into odd bit lines and even bit lines. In an odd/even bit line architecture, memory cells along a common word line and connected to the odd bit lines are programmed at one time, while memory cells along a common word line and connected to even bit lines are programmed at another time.

FIG. 4 shows more details of block i of memory array 200. Block i includes X+1 bit lines and X+1 NAND strings. Block i also includes 64 data word lines (WL0-WL63), two dummy word lines (WL_d0 and WL_d1), a drain side select line (SGD) and a source side select line (SGS). One terminal of each NAND string is connected to a corresponding bit line via a drain select gate (connected to select line SGD), and another terminal is connected to the source line via a source select gate (connected to select line SGS). Because there are 64 data word lines and two dummy word lines, each NAND string includes 64 data memory cells and two dummy memory cells. In other embodiments, the NAND strings can have more or fewer than 64 data memory cells and two dummy memory cells. Data memory cells can store user or system data. Dummy memory cells are typically not used to store user or system data. Some embodiments do not include dummy memory cells.

Figure 5:
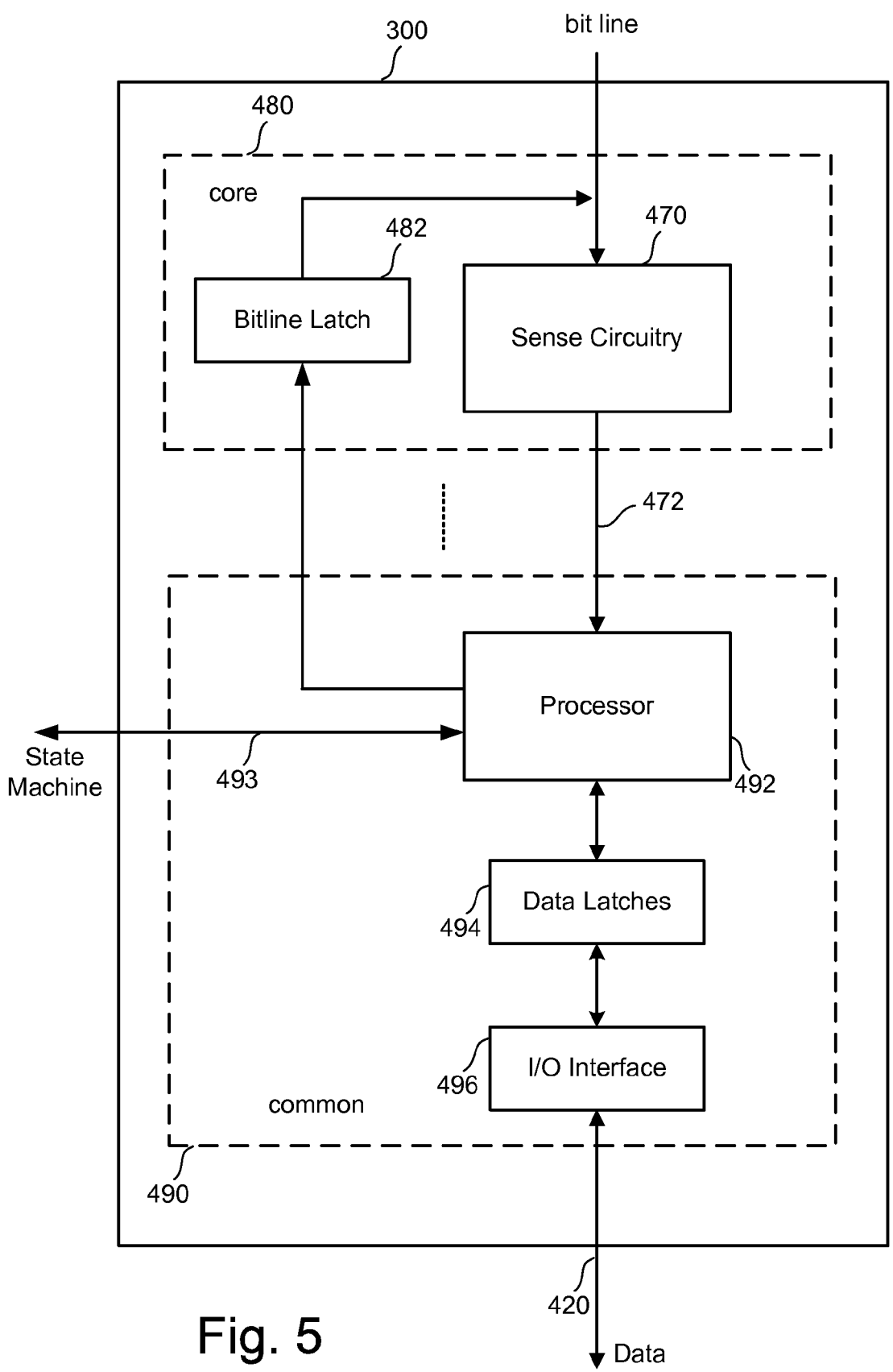
FIG. 5 is a block diagram depicting one embodiment of a sense block.

FIG. 5 is a block diagram of an individual sense block 300 partitioned into a core portion, referred to as a sense module 480, and a common portion 490. In one embodiment, there will be a separate sense module 480 for each bit line and one common portion 490 for a set of multiple sense modules 480. In one example, a sense block 300 will include one common portion 490 and eight sense modules 480. Each of the sense modules 480 in a group will communicate with the associated common portion 490 via a data bus 472. For further details, refer to U.S. Patent Application Publication 2006/0140007, which is incorporated herein by reference in its entirety.

Sense module 480 comprises sense circuitry 470 that determines whether a conduction current in a connected bit line is above or below a predetermined threshold level. In some embodiments, sense module 480 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd).

Common portion 490 comprises a processor 492, a set of data latches 494 and an I/O Interface 496 coupled between the set of data latches 494 and data bus 420. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 420 during a program operation. The imported data bits represent write data meant to be programmed into the memory. I/O interface 496 provides an interface between data latches 494 and the data bus 420.

During read or sensing, the operation of the system is under the control of state machine 222 that controls the supply of different control gate voltages to the addressed cell. As it steps through the various predefined control gate voltages corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

It is anticipated that some implementations will include multiple processors 492. In one embodiment, each processor 492 will include an output line (not depicted in FIG. 5) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 492 to accumulate the results of the associated bit lines such that the state machine need only read the wired-OR line one time.

During program or verify, the data to be programmed is stored in the set of data latches 494 from the data bus 420. The program operation, under the control of the state machine, comprises a series of programming voltage pulses (with increasing magnitudes) applied to the control gates of the addressed memory cells. Each programming pulse is followed by a verify process to determine if the memory cell has been programmed to the desired state. Processor 492 monitors the verified memory state relative to the desired memory state. When the two are in agreement, processor 492 sets the bit line latch 482 so as to cause the bit line to be pulled to a state designating program inhibit. This inhibits the cell coupled to the bit line from further programming even if it is subjected to programming pulses on its control gate. In other embodiments the processor initially loads the bit line latch 482 and the sense circuitry sets it to an inhibit value during the verify process.

Data latch stack 494 contains a stack of data latches corresponding to the sense module. In one embodiment, there are 3-5 (or another number) data latches per sense module 480. In one embodiment, the latches are each one bit. In some implementations (but not required), the data latches are implemented as a shift register so that the parallel data stored therein is converted to serial data for data bus 420, and vice versa. In one preferred embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the read operations and sense amplifiers can be found in (1) United States Patent Application Pub. Nos. 2004/0057287, "Non-Volatile Memory And Method With Reduced Source Line Bias Errors," published on Mar. 25, 2004; (2) 2004/0109357, "Non-Volatile Memory And Method with Improved Sensing," published on Jun. 10, 2004; (3) 20050169082; (4) 2006/0221692, "Compensating for Coupling During Read Operations of Non-Volatile Memory," published on Oct. 5, 2006; and (5) 2006/0158947, "Reference Sense Amplifier For Non-Volatile Memory," published on Jul. 20, 2006. All five of the immediately above-listed patent documents are incorporated herein by reference in their entirety.

At the end of a successful programming process (with verification), the threshold voltages of the memory cells should be within one or more distributions of threshold voltages for programmed memory cells or within a distribution of threshold voltages for erased memory cells, as appropriate. FIG. 6A illustrates example Vt distributions corresponding to data states for the memory cell array when each memory cell stores four bits of data. Other embodiment, however, may use more or fewer than four bits of data per memory cell. FIG. 6A shows 16 Vt distributions corresponding to data states 0-15. In one embodiment, the threshold voltages in state 0 are negative and the threshold voltages in the states 1-15 are positive. However, the threshold voltages in one or more of states 1-15 may be negative.

Between each of the data states 0-15 are read reference voltages used for reading data from memory cells. For example, FIG. 6A shows read reference voltage Vr1 between data states 0 and 1, and Vr2 between data states 1 and 2. By testing whether the threshold voltage of a given memory cell is above or below the respective read reference voltages, the system can determine what state the memory cell is in.

At or near the lower edge of each data state 0-15 are verify reference voltages. For example, FIG. 6A shows Vv1 for state 1 and Vv2 for state 2. When programming memory cells to a given state, the system will test whether those memory cells have a threshold voltage greater than or equal to the verify reference voltage.

FIG. 6B illustrates that another embodiment of Vt distributions corresponding to data states 0-15 can partially overlap since the correction algorithm can handle a certain percentage of cells that are in error. A point to note is that contrary to the equal spacing/width of the depicted sixteen states, various states may have different widths/spacings in order to accommodate varying amounts of susceptibility to data retention loss. In some embodiments, states 0 and/or 15 are wider than the other states.

Also note that the Vt axis may be offset from actual voltages applied to the control gates as body effect through source or body biasing is used to shift negative threshold voltage into the measurable positive range. One technique that is used to measure a negative threshold voltage is what will be referred to as "source follower sensing," which is performed as follows. First the bit lines are discharged to ground. Then, a higher than zero voltage (e.g., 2.2V) is applied to the common source line. However, the bodies of the memory cells are kept at ground. Current flows from the source to the bit lines causing the bit lines to charge up towards the source line voltage. Charging of the bit lines stops when the body effect turns off at least one of the memory cells in a NAND chain. The voltage on the bit line when the NAND chain stopped charging is sensed to determine the threshold voltage of the memory cell that turned off, which will be the highest threshold voltage on the NAND chain. Using this technique negative threshold voltages approaching Vdd can be measured.

Other techniques can be used to sense negative threshold voltages such as applying a negative voltage to the control gates.

Figure 8:
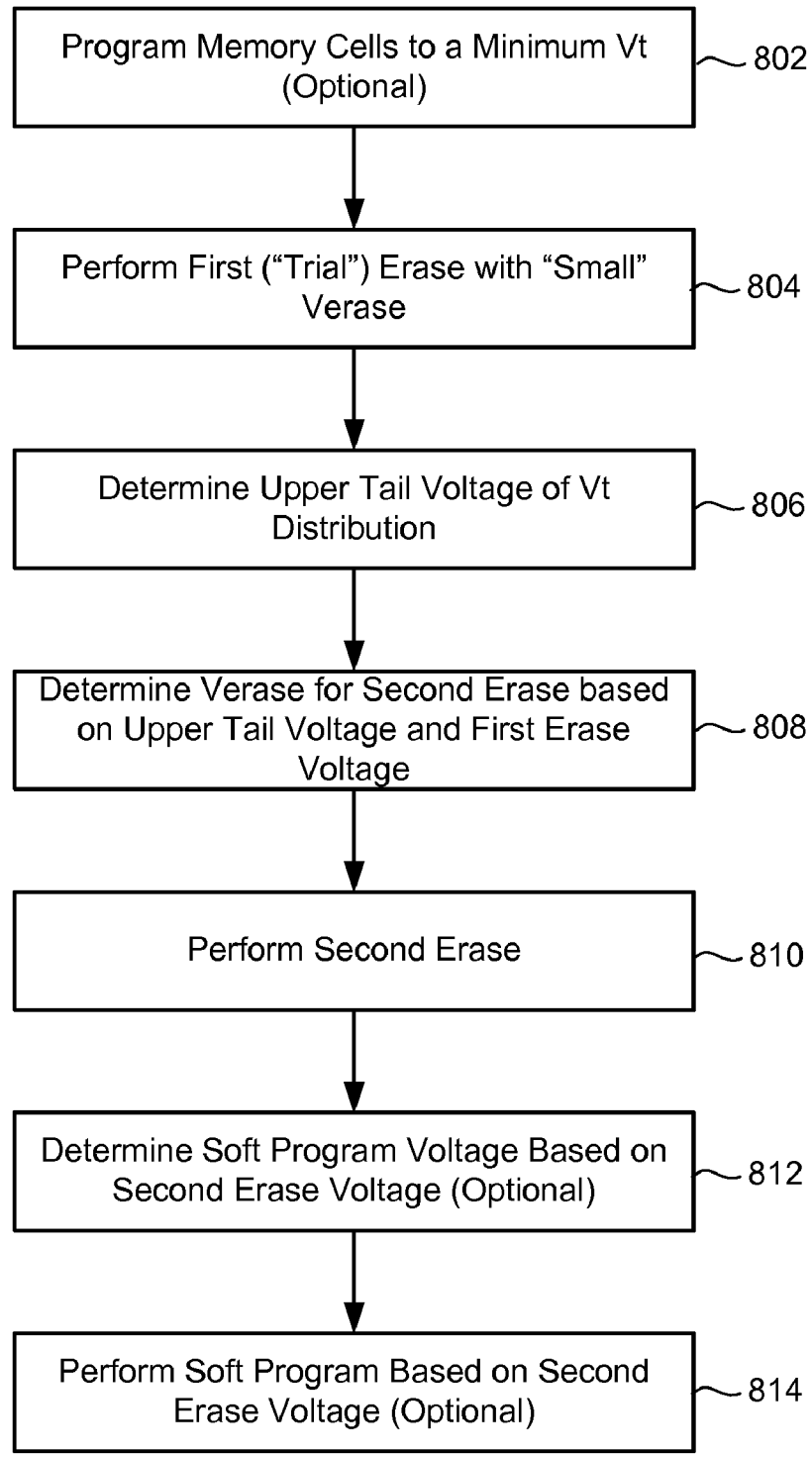
FIG. 8 depicts one embodiment of erasing memory cells.

FIG. 7 is a flow chart describing one embodiment of a process for erasing and programming memory cells. The process of FIG. 7 is performed by the one or more managing circuits described above. In step 702, the system will receive a request to erase data. In one embodiment, it is possible that there will not be a dedicated erase command. Rather, the system will erase (prior to programming) in response to a request to program. In step 704, the blocks to be erased are selected. In step 706, the memory cells are erased. FIG. 8 depicts one embodiment of erasing memory cells.

In step 708 of FIG. 7, the system will receive a request to program data. A dotted line is depicted to connect step 706 to step 708 because there could possibly be a long time lapse between the two steps. In step 710, the memory cells will be programmed. The memory cells can be programmed in step 710 according to many of various programming methods known in the art. In one embodiment, the memory cells are programmed to result in none of the memory states being favored over another. For example, if there are four data states, then about 25 percent of the memory cells are programmed to each of the data states regardless of what data is being stored. FIG. 10A depicts an example of this "randomizing."

FIG. 8 depicts one embodiment of a process 800 of erasing memory cells. The process 800 of FIG. 8 is one technique for implementing step 706 in FIG. 7. In optional step 802, memory cells are programmed to some minimum threshold voltage. As an example, substantially all of the memory cells are programmed to a Vt of at least one volt above the measureable Vt window. The measurable Vt window is the range of Vts that are used to store valid data on the particular memory device. The bottom of the window varies depending upon factors such as whether or not negative Vt sensing is employed. In an implementation that does not use negative sensing of Vts, the beginning of the measurable Vt window is approximately 0V. In an implementation that uses negative sensing, the beginning of the measurable Vt window can go almost as negative as to −Vdd. For example, using negative sensing, the beginning of the measurable Vt window is approximately −1.6 V with a Vdd of 2.2V. Negative sensing is performed as follows, in one implementation. The source and the Pwell are held at 1.6 V. The drain is held at 1.6 V+Vb1, where Vb1 is the voltage to which the bit line is pre-charged. As an example, Vb1 is 0.4 V. In this type of negative sensing, there is no body effect as the source and Pwell are held at the same voltage. In one embodiment, negative Vt sensing is performed by applying a negative voltage to the control gates.

In one embodiment, to program beyond the minimum Vt, all of the word lines in the block (or other unit) are raised to a moderate programming voltage such as 16V. FIG. 9A depicts four Vt distributions of the memory cells prior to applying a program pulse of step 802. Each Vt distribution corresponds to one of four data states that are used in this example. Note that some data states have a greater number of memory cells than others. In FIG. 9A, the lowest measurable Vt may be 0 V and the highest measureable Vt may be 6 V, for example. FIG. 9B depicts the Vt distribution after applying the pulse of step 802 in which substantially all of the memory cells have been programmed to at least a minimum Vt. In FIG. 9B that minimum Vt is at least a certain voltage above the lowest measurable Vt. As an example, the memory cells are programmed to at least about 1 V above the lowest measurable Vt.

One reason for performing step 802 is to pre-condition the memory cells prior to the trial erase to allow more accurate determination of a reference point on the threshold distribution after the trial erase. In one implementation, the reference point is referred to herein as the "upper tail Vt," as the reference point is typically on the very upper end of the Vt distribution. Later steps of process 800 determine counts based on how many memory cells have Vts above read reference voltages that are applied to the memory cells after a trial erase has been performed. In one implementation, the counts are made on a NAND string basis. That is, if one or more memory cells in a NAND string satisfy a condition, then the NAND string is counted. However, counting does not have to be performed on a NAND string basis. After applying the pulse of step 802, the lowest Vt of substantially all of the memory cells should be above the read reference voltages to ensure that memory cells that are later counted will be memory cells that were erased by the trial erase pulse.

Step 802 is not a requirement. If a reasonably known fraction of the memory cells are in a non-erased state, then it may not be necessary to perform step 802. For example, if memory cells have been programmed as depicted in FIG. 10A, then it may be assumed that about 25 percent of the memory cells will be programmed to each state. Note that it is acceptable to have some percentage of the memory cells in the erased state so long as that percentage is known.

In step 804, a trial erase of the memory cells is performed. In one embodiment, the magnitude of the trial erase voltage is sufficiently low to ensure that a the upper portion of the erase distribution is in the measurable Vt window such that certain read reference voltages can be applied to the memory cells to determine how many memory cells have Vts above the read reference voltages. Note that a portion of the Vt distribution may be below the lowest measurable Vt, so long as the upper portion is in the measureable Vt window. Later steps of process 800 will apply read voltages and determine counts of how many NAND strings have Vts above the read voltages. The upper tail Vt will be determined based on those counts.

Note that it becomes harder to erase some memory devices over time. Therefore, characteristics (e.g., magnitude) of the trial erase pulse may be a function of memory device usage (e.g., erase/program cycles). For some devices, the increase in difficulty in erasing memory cells may be approximately logarithmic. Thus, the adjustment to the trial erase pulse may be made at 100 cycles, 1K cycles, 10K cycles, for example. In some embodiments, the number of erase/program cycles are tracked and the trial erase pulse is adjusted based thereon. Tracking may be on a block-by-block basis, but this is not required. Note that due to wear leveling procedures, it may be possible, at any given time during the life of the product, to use the same trial erase pulse for all blocks in a given device as it may be assumed a similar level of wear in each block.

FIG. 9C depicts an erase threshold distribution after the trial erase for the case in which the programming pulse of step 802 was applied (see FIG. 9B). The upper tail Vt is a point near the upper end of the Vt distribution. The upper tail Vt may be defined based on ignoring a certain number of outlying Vts. For example, about 31 memory cells have Vts to the right of the upper tail Vt. The upper tail Vt can be defined based on any number other than 31. If counting is performed on a NAND string basis, then a certain number of NAND strings are ignored. As an example, NAND strings are examined to determine whether a given NAND string has at least one memory cell with a Vt above a read reference voltage. The read reference voltage is adjusted until about 31 of the NAND strings have at least one memory cell with a Vt above the read reference voltage. Thus, about 31 NAND strings have at least one memory cell with a Vt above the upper tail Vt. Note that there may be about 75,000 NAND strings in the block. The upper tail Vt may also be defined based on statistics. For example, if the Vt distribution is characterized by a mean and a standard deviation, then the upper tail Vt may be defined as a certain real number of standard deviations above the mean.

As previously discussed, it is not required that the programming pulse of step 802 be applied. FIG. 10B depicts an example Vt distribution after the trial erase when the programming pulse of step 802 is not used. The lowest measurable Vt may be about 0 V and the highest measureable Vt may be about 6V, for example. In this example, about 25 percent of the memory cells were programmed to each of the four different states as a result of the normal programming process (see FIG. 10A). The lower portion of the Vt distribution may be uneven after the trial erase, as depicted in FIG. 10B. However, the upper portion of the Vt distribution is relatively smooth. More significantly, the approximate shape that upper portion of the Vt distribution will have after the trial erase can be predicted, which allows accurate determination of the upper tail Vt based on a minimal amount of reads. Further details of determining the upper tail Vt are discussed below.

In one embodiment, the trial erase is achieved by raising the p-well to an erase voltage for a sufficient period of time and grounding the word lines of a selected block while the source and bit lines are floating. Due to capacitive coupling, the unselected word lines, bit lines, select lines, and the common source line are also raised to a significant fraction of the erase voltage. A strong electric field is thus applied to the tunnel oxide layers of selected memory cells and the data of the selected memory cells are erased as electrons of the floating gates are emitted to the substrate side, typically by Fowler-Nordheim tunneling mechanism. As electrons are transferred from the floating gate to the p-well region, the Vt of a selected cell is lowered. Erasing can be performed on the entire memory array, on individual blocks, or another unit of cells.

In step 806, an upper tail Vt is determined at some bit level of interest. The bit level of interest refers to how many Vts are ignored. For example, because there can be expected to be a number of outlying Vts in a Vt distribution, a certain number of the outliers can be ignored. As previously discussed, a single Vt can be determined for an entire NAND string. Thus, in one implementation, the bit level of interest refers to how many NAND strings are allowed to have at least one memory cell with a Vt above the upper tail Vt. The upper tail Vt serves as a reference point for later calculations.

In one implementation, the bit level of interest is based on the number of NAND strings that the storage device 210 "ignores" during an erase verify. That is, even if a certain number of NAND strings have one or more memory cells with a Vt greater than the target level, the erase verify passes. As an example, the storage device 210 might allow 31 NAND strings in each block to have one or more memory cells with a Vt above the target level. Typically, the device performs the erase verify on a NAND string basis. That is, an erase verify voltage is applied to each word line in the block. Each memory cell in a given NAND string should turn on for the erase verify to pass. In one embodiment, the erase verify passes provided that no more than a certain number of NAND strings fail verification. While it is possible to examine the Vts of individual memory cells in those NAND strings that failed verification to determine whether multiple memory cells caused the verification to fail, this is not required. Note that having a certain number of memory cells with Vts above the target level does not present a data integrity problem because ECC can correct these values. That is, if a later read operation finds that some of the memory cells are actually in a higher state, ECC will correct the problem. However, other techniques can be used to determine the upper tail Vt.

The exact point on the upper tail to be used as the reference point is not critical. Furthermore, while FIG. 9C and FIG. 10B depict the reference point as being at the very upper portion of the voltage distribution (i.e., an upper tail), the reference point is not required to be at the very upper end. For example, a reference point that is closer to the mean might be selected. However, for purposes of discussion, the reference point that is discussed will be on the upper tail.

Further details of determining the upper tail Vt are discussed below with reference to FIGS. 11A, 11B, 11C, 11D, 12A, and 12B.

In step 808, a second erase voltage is determined based on the trial erase voltage and the upper tail Vt. In one embodiment, the second erase voltage (VE2) is determined based on the following equations.

$$VE2=VE1+(VU1/S)+M \qquad \text{Eq. 1}$$

$$S=\Delta VT/\Delta VE \qquad \text{Eq. 2}$$

In Equation 1, VE1 is the trial erase voltage from step 804, and VU1 is the upper tail Vt that was determined in step 806. The parameter "S" is based on how responsive the memory cells are to erase voltages. That is, S is based on how far the upper tail Vt is expected to shift per unit increase in erase voltage. Equation 2 defines S as the shift of the upper tail Vt per 1 V increase in erase voltage. In one implementation, the parameter S is calculated based on tests of a sample memory device and may be used for all similar memory devices. Thus, no determination of S is needed in the field. However, S can be determined or modified in the field. Furthermore, a different value of S could be used for different memory devices having the same design. For example, S can be fine tuned to account for semiconductor process variations in different batches of memory devices. The parameter S might even be fine tuned for each memory device. For example, when the memory device is manufactured a test may be performed to determine how susceptible memory cells on that particular memory device are to erase pulses. A value for S may be programmed into the particular memory device based on the test results.

Note that there may be some variation in how susceptible memory cells are to erase voltages. This variation may be memory cell to memory cell, block to block, memory die to memory die, lot to lot, etc. The parameter "M" in Equation 1 is a margin number to ensure that the second erase is strong enough to account for possible variations. The value of M is selected to ensure that those memory cells that are less susceptible to erase voltages will be sufficiently erased. It may be that some memory cells will be over-erased to a small extent. For example, memory cells that are more susceptible to erase voltages than average may be over-erased. However, having some memory cells over erased is acceptable.

Note that just as with the parameter S, the parameter M may be fine tuned on a device by device basis, on a batch by batch basis, etc. Furthermore, while the parameter M may be programmed into the memory device at manufacture, a suitable value for M can be determined in the field. Also, the value that was programmed into the device at manufacture can be fined tuned in the field.

Furthermore, note that the actual determination of the second erase voltage may be performed by either calculation or a table lookup. For example, in one implementation the input to the table is the upper tail voltage and the trial erase voltage. The output of the table is the second erase voltage.

In step 810, a second erase is performed using the erase voltage that was determined in step 808. In one embodiment, the second erase is achieved by raising the p-well to an erase voltage for a sufficient period of time and grounding the word lines of a selected block while the source and bit lines are floating. In one embodiment, the erase is completed at this point with no erase verify operation. Thus, the second erase may be completed with a single erase pulse. Verifying the erase threshold distribution is not a requirement. However, an erase verify may optionally be performed. If so, then process 1300 of FIG. 13 may be performed. Note that if an erase verify operation is performed, it may be necessary to sense a negative Vt. However, in implementations in which the final erase Vt distribution is not verified, there is no need to perform negative Vt sensing.

After the erase is performed, it is possible that some of the memory cells may be in a deeper erased state than necessary. Soft programming, which is a small programming pulse, can be used to nudge the Vt of some of the erased memory cells upwards. In particular, soft programming nudges the Vts of the most deeply erased memory cells such that the erase threshold distribution is compacted.

In optional step 812, a soft program voltage is determined based on the second erase voltage. There exists a correlation between the voltage needed to erase memory cells and the voltage need to program those memory cells as a block is cycled. In some implementations, erase becomes harder and programming becomes easier with more program/erase cycles. Therefore, knowledge of the value of the erase voltage that was required to erase the block to a deep enough level allows the calculation of the correct value of the soft program pulse that can tighten the erase distribution. In one implementation the soft programming voltage is determined based on the following equation:

$$Vsp=Vref-Ve2*K \qquad \text{Eq. 3}$$

In Equation 3, Ve2 is the magnitude of the second erase voltage. The parameter Vref is a reference voltage and K is a constant. Suitable values for Vref and K may be determined based on tests performed on sample devices. In one embodiment, the soft program voltage is determined by applying an equation such as Equation 3. In one embodiment, a lookup table is used to obtain the value of the soft program pulse, based on the second erase voltage.

Note that if the soft program pulse is too weak it will not help to tighten the erase distribution and if the soft program pulse is too strong it can program the memory cells out of the erased state and into one or more of the programmed states. However, a soft program pulse with the proper amplitude will tighten the erase distribution. A possible reason for the foregoing is that memory cells with higher coupling ratios are both easier to erase and easier to program than cells with lower coupling ratios. Cells with higher coupling ratios will end up at the lower portion of the erase distribution after an erase pulse. A soft programming pulse with the proper amplitude will nudge the Vts of these cells before the rest of the memory cells start to program, thereby tightening the erase distribution. But if the soft programming pulse is too strong, then all the memory cells will start to program, and the tightening effect is lost.

In optional step 814, the soft program voltage is used to compact the erase threshold distribution. In some implementations, there is no verification of the soft programming. Because there is no verification, only a single soft program pulse is applied. However, verification of the soft programming can be performed. If so, process 1400 of FIG. 14 may be performed.

In one embodiment, fresh blocks with a low cycle count are erased using a single erase pulse without using process 800 of FIG. 8. After erasing becomes more difficult and a single pulse is no longer sufficient to erase the block, the process 800 of FIG. 8 is used.

Figure 11A:
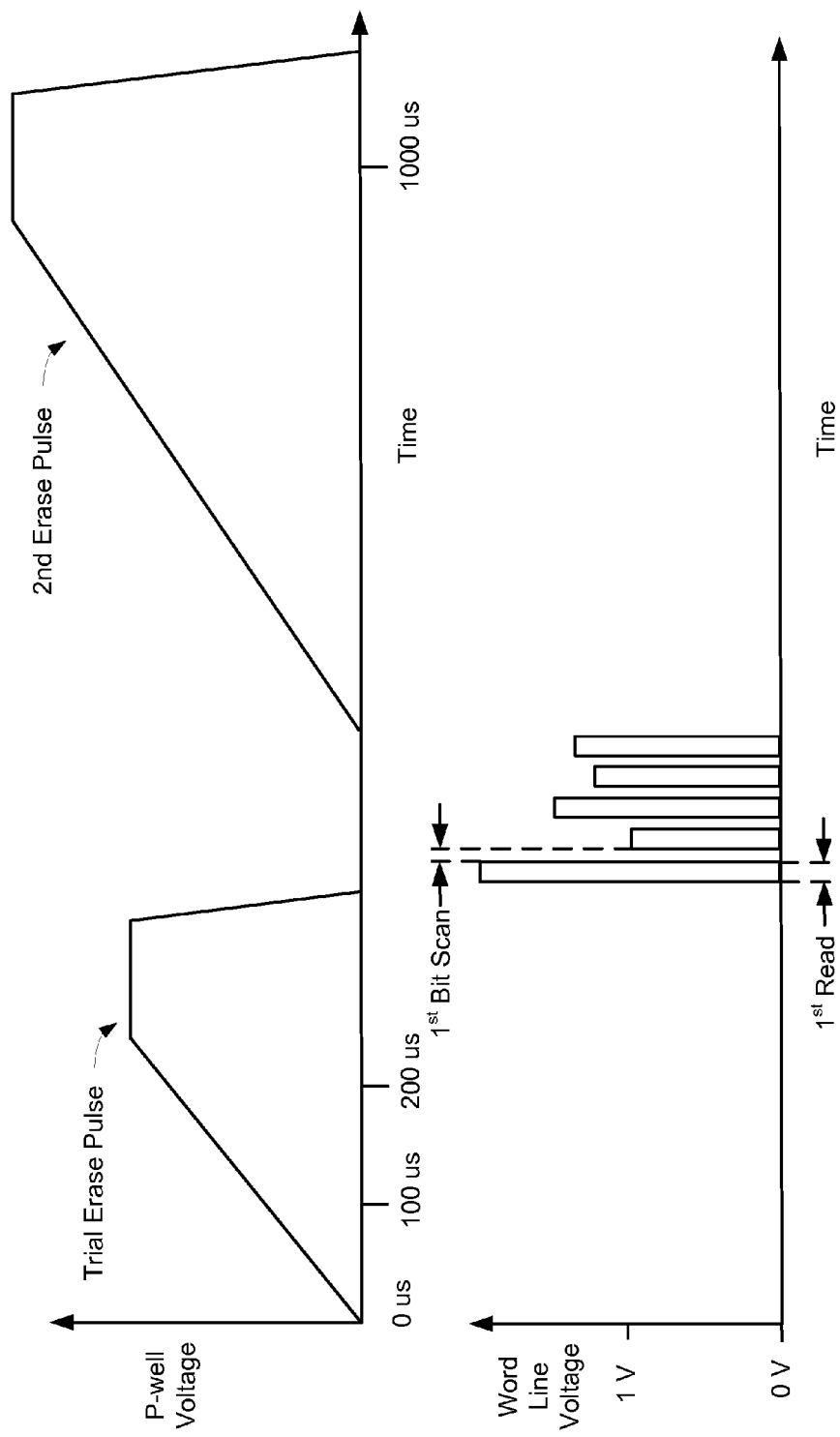
FIG. 11A depicts a graph of P-well voltage versus time and a graph of word line voltage versus time.

FIG. 11A depicts a graph of P-well voltage versus time and a graph of word line voltage versus time. The graph of P-well voltage depicts two different erase voltage pulses that are applied to the P-wells to erase the memory cells. The other graph depicts the voltages applied to the word lines during a scan to seek the upper tail Vt. Briefly, the graphs depict applying a trial erase pulse followed by performing a binary search for the upper tail Vt. The binary search involves applying a first read voltage to the word lines followed by a bit scan operation in which a count is made based on how many of the memory cells fail to turn on in response to the read voltage. Based on that count, the read voltage is adjusted up or down and re-applied to the word lines. In one implementation, each read takes about 20 micro-seconds and each bit scan takes about 12 micro-seconds. The upper tail Vt is determined based on results of the binary search. The second erase pulse is determined based on the upper tail Vt. The second erase voltage is then applied to the P-wells of the memory cells.

Figure 11B:
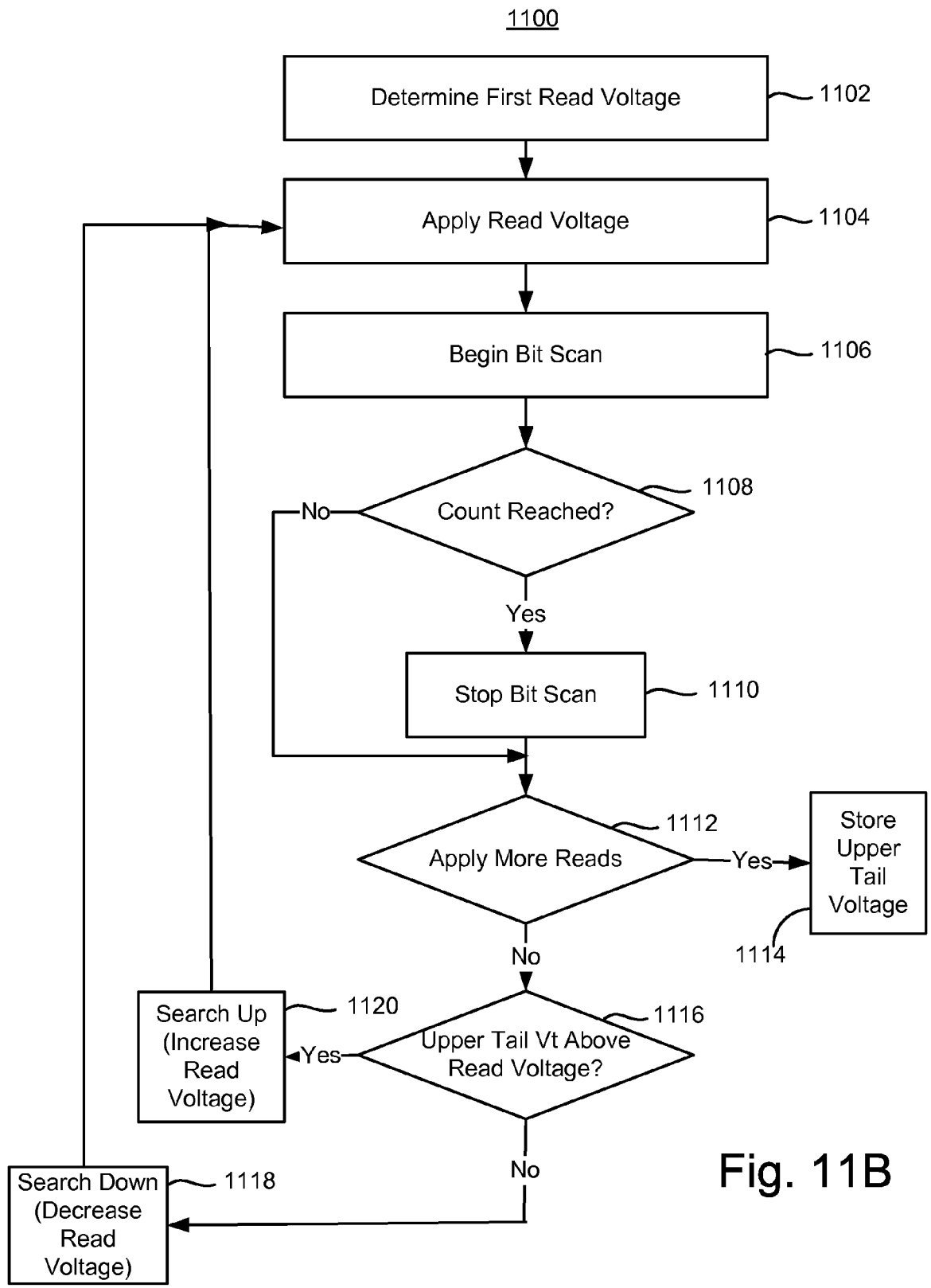
FIG. 11B depicts one embodiment of a process of performing a scan of memory cells in a block (or other unit) to determine an upper tail Vt after a trial erase.

FIG. 11B depicts one embodiment of a process 1100 of performing a scan of memory cells in a block (or other unit) to determine an upper tail Vt after a trial erase. Process 1100 is one technique for implementing step 806 of FIG. 8. Process 1100 will be discussed with reference to FIG. 11A. In particular, the lower graph in FIG. 11A depicts example voltages applied to word lines during a binary search for the upper tail Vt.

In step 1102, a first read voltage is determined based on a window in which the binary search will be performed. The window for the binary search is sufficiently wide such that the upper tail Vt is expected to be within the window. In one implementation, the window ranges from 0 to 4 volts. In one implementation, the window ranges from 0 to 6 volts. The window is not required to start at 0 volts, although the window should start at a voltage that is within the measurable Vt window. For example, if negative Vt sensing is used, then the measurable Vt window could start below 0 Volts. In the example depicted in FIG. 11B, the first read voltage is 2 volts based on a window that ranges from 0 to 4 volts.

In step 1104, a first read voltage is applied to the word lines of the memory cells. The first read voltage may be applied simultaneously to each word line. Thus, the first read is intended to read one condition for each entire NAND string, as opposed to a condition of each memory cell on a NAND string. However, it is not required that the first read voltage be applied simultaneously to each word line. Thus, each memory cell could be read individually.

In step 1106, a bit scan begins to count how many of the NAND strings have one or more memory cells with a Vt above the read voltage. The bit scan determines how many of the NAND strings have at least one memory cell that fail to turn on in response to the first read voltage. In one embodiment, the bit scan stops once a certain count is reached. For example, if the upper tail Vt is defined based on allowing 31 NAND strings to have one or more memory cells with Vts above a certain point, then the count may stop once that level is reached. The count is not required to be performed on a NAND string basis. In FIG. 11B, the time period labeled a "bit scan" refers to the period in which the count is being made.

Another technique for performing the bit scan is to start the search from a point (e.g., central point) and alternate away from that point. The scan continues until a transition is reached. A transition is defined based on how many of the NAND strings fail to turn on. As an example, the transition is based on whether 31 or fewer NAND strings fail to turn on. To illustrate, the following sequence of voltages are applied.

2.0, 2.1, 1.9, 2.2, 1.8, 2.3, 1.7, 2.4, 1.6

Note that each successive voltage is on the opposite side of the starting point. In the above example, a transition occurred when 1.6 volts are applied. Thus, the upper tail is determined to be between 1.6 and 1.7 volts. As a further example, had the transition occurred when 2.4 volts were applied, the upper tail would be between 2.3 and 2.4 volts. Note that, in this embodiment, the central point is selected based on an expectation of where the upper tail is likely to be. Thus, this scan can be very efficient.

In one embodiment, the count is performed "on-chip." Thus, data does not need to be transferred from the memory die 212 to the controller 244 to perform the count. By avoiding this data transfer the count can be performed very rapidly. In one embodiment, counting performed on chip can only reach a limited value. For example, the on chip circuitry may be able to count up to 32, 64, or some other value. After that count is reached, the counter overflows. The count upon which the upper tail Vt is defined may be at the point the counter overflows. However, the upper tail Vt could be defined to be a smaller number.

In one embodiment, the on chip counting is performed in two stages. In the first stage, different groups of NAND strings are examined. A value of either 1 or 0 is determined for each NAND string group based on whether there is at least one memory cell in a given NAND string group having a Vt above the current read voltage. If the NAND string group count goes over the limit, the scan stops. In the second stage, each of the groups that have a value of 1 is examined to determine how many NAND strings have one or more memory cells with a Vt above the current read. If the counter overflows during the second stage, counting stops.

Thus, if the count overflows (step 1108), the bit scan is stopped (1110). Otherwise, the bit scan continues until all of the NAND strings are read.

In step 1112, a determination is made whether another read voltage should be applied. For example, referring to FIG. 11A, five read voltages are applied. The search could use more or fewer iterations to achieve a different resolution. If the upper tail Vt is not found within the search window, then the search window can be expanded and the process 1100 repeated. For example, it is possible that the upper tail Vt is above 4 Volts. However, the trial erase voltage of step is selected to place the upper tail Vt distribution in a 4V range that starts from the beginning of the measurable Vt window. A 4 Volt window should be a sufficient range to cover block to block, die to die, wafer to wafer, and lot to lot variations at any cycle point. If the upper tail Vt does fall outside of the 4V window, then the window can be expanded to, for example, 6V.

If there are no more read voltages to apply, then the upper tail Vt is stored, in step 1114. Note that since the last two read voltages "straddle" the upper tail Vt, the value that is stored can be either of the last two read voltages or any value between. In one embodiment, the average value of the two values that straddle the upper tail Vt is obtained and used as the upper tail Vt value. If the desired resolution has not yet been reached, then control passes to step 1116.

In step 1116, a determination is made whether upper tail Vt is above or below the last read voltage. In some embodiments, the count from the bit scan will either be at the maximum value (e.g., 32) or some value less than that. In these embodiments, a count of less than 32 indicates that the upper tail Vt is less than the last read voltage that was applied. Therefore, the read voltage is reduced (e.g., from 2V to 1V). After reducing the read voltage (step 1118), control passes to step 1104 to apply the new read voltage to the word lines.

On the other hand, if the count was exceeded, then the read voltage is increased (e.g., from 1 V to 1.5 V). After increasing the read voltage (step 1120), control passes to step 1104 to apply the new read voltage to the word lines.

Figure 11C:
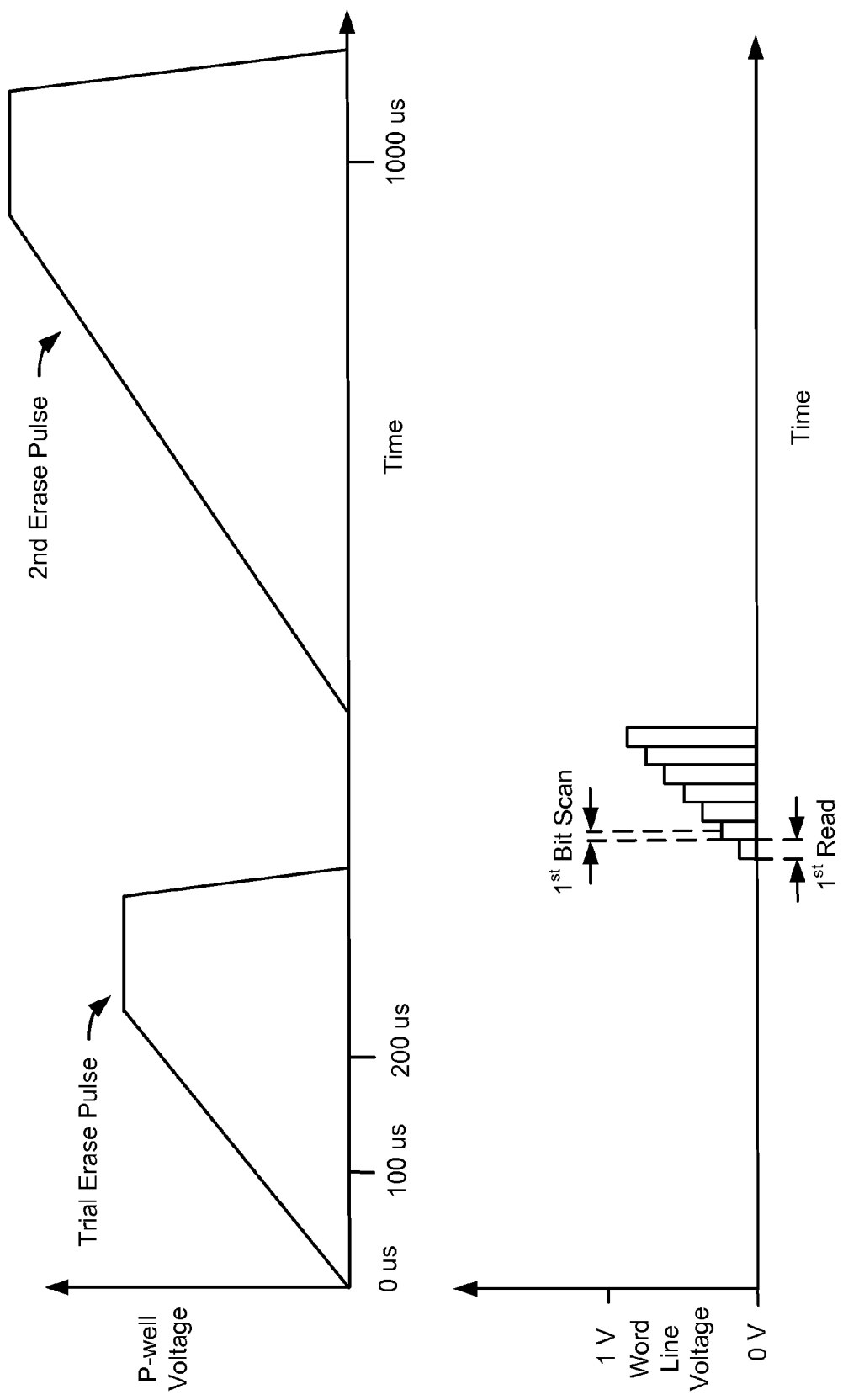
FIG. 11C depicts a graph of P-well voltage versus time for two different erase voltages applied to the P-wells to erase the memory cells and a graph of word line voltages versus time.

In one embodiment, a linear search for the upper tail Vt is performed. FIG. 11C depicts P-well voltage for two different erase voltages applied to the P-wells to erase the memory cells and word line voltages applied to the memory cells during a linear scan for the upper tail Vt. Briefly, the trial erase pulse is applied followed by performing a linear search for the upper tail Vt. The second erase voltage is then applied to the P-wells of the memory cells. The linear search involves applying a first read voltage to the word lines followed by a bit scan operation in which a count is made of how many NAND strings have at least one memory cells fail to turn on in response to the read voltage. In the depicted embodiment, the next read voltage is applied prior to determining the count. The read voltages are increased until the upper tail Vt is found.

Figure 11D:
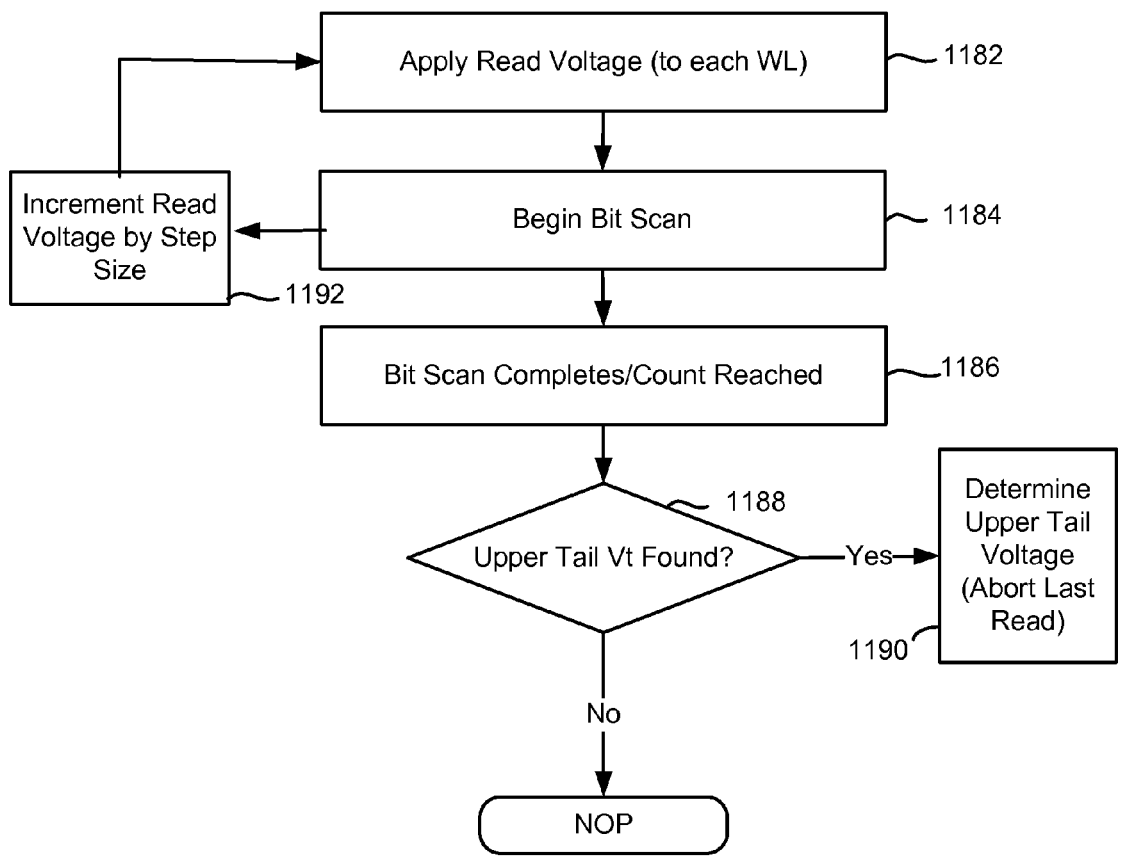
FIG. 11D depicts one embodiment of a process of performing a scan of memory cells in a block to determine an upper tail Vt after a trial erase.

FIG. 11D depicts one embodiment of a process 1180 of performing a scan of memory cells in a block to determine an upper tail Vt after a trial erase. The process is one technique for implementing step 806 of FIG. 8. FIG. 11D will be discussed with reference to FIG. 11C.

In step 1182, a read voltage is applied to the word lines of the memory cells. The first read voltage may be applied simultaneously to each word line. Thus, the first read is intended to read one condition for each entire NAND string, as opposed to a condition of each memory cell on a NAND string. However, it is not required that the first read voltage be applied simultaneously to each word line. Thus, each memory cell could be read individually.

In step 1184, a bit scan based on results of the first read is begun. That is, counting of the number of NAND strings that have one or more memory cells with a Vt that is higher than the read voltage is begun. Note that the next read voltage may be applied while the counting continues because the magnitude of the next read voltage does not depend on the count. This is depicted in FIG. 11C, where the first bit scan is depicted as occurring during the second read. In process 1180, this is depicted in step 1192 as increasing the read voltage by the step size and returning to step 1182. In step 1186, the bit scan completes. The bit scan stops if the count of NAND strings reaches a certain level. For example, if 31 NAND strings are found with a memory cell having a Vt higher than the read voltage, then the bit scan is stopped.

In step 1188, a determination is made as to whether or not the upper tail Vt has been found at the desired resolution. Referring to FIG. 11C, initially read voltages are at the lower end of the window. Therefore, it is expected that the maximum count will be reached for the first reads. That is, it is expected that the upper tail Vt is above the first read voltage. When the read voltage is greater than the upper tail Vt the count will not be reached indicating that the upper tail Vt is between this read and the previous. If a greater resolution is desired, then a read voltage someone between the last two read voltages is selected and control passes to step 1182 to apply the new read voltage.

Otherwise, an upper tail voltage is determined based on the last two read voltages in step 1190. Also, because a new read may be started when the bit scan begins, the last read may be aborted.

Figure 12A:
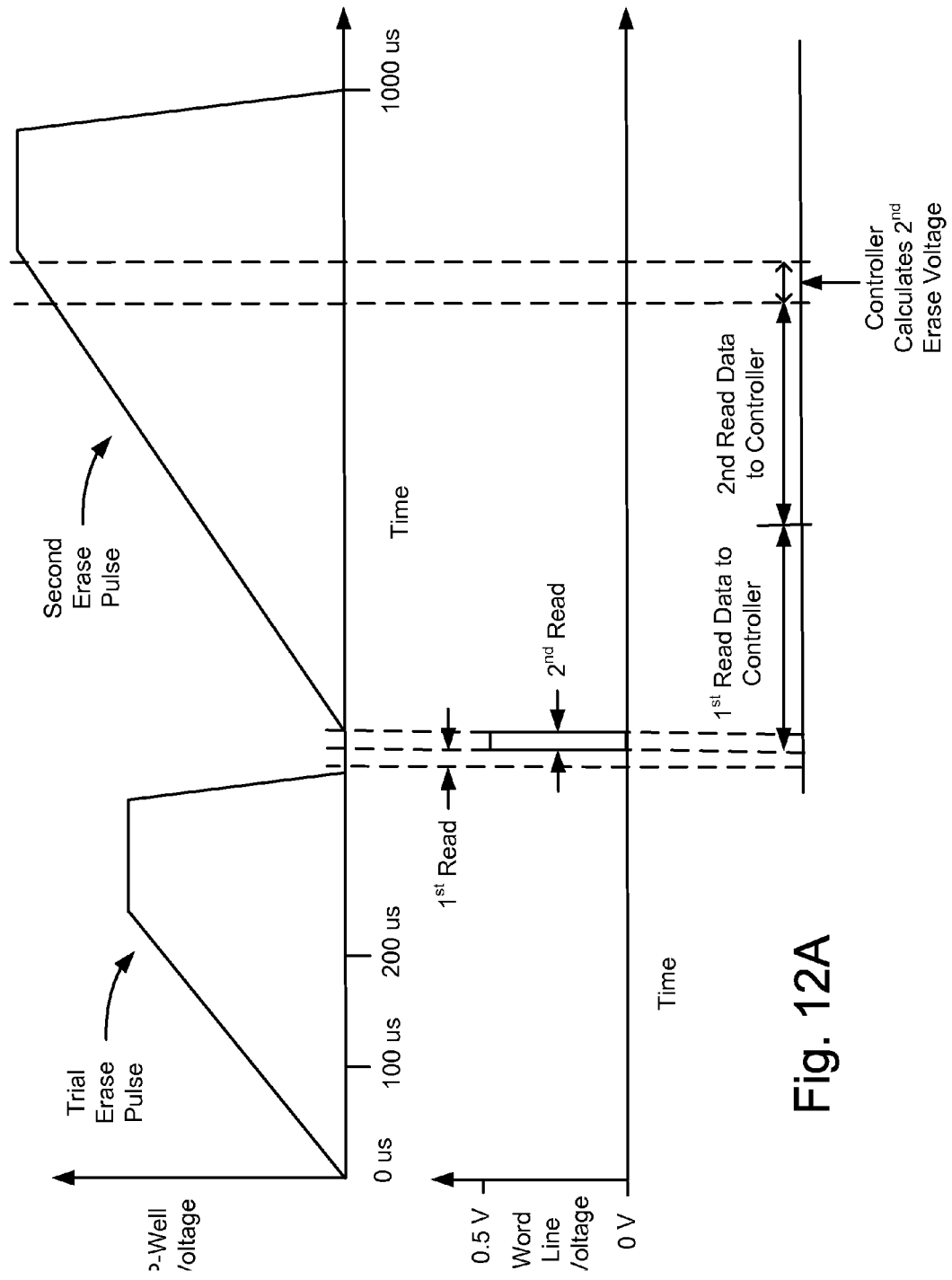
FIG. 12A depicts one embodiment of the timing relationship between erase pulses applied to memory cells and read voltages applied to the memory cells to collect data to determine a suitable magnitude for a second erase pulse.

FIG. 12A depicts one embodiment of the timing relationship between erase pulses applied to the memory cells and read voltages applied to the memory cells to collect data to determine a suitable magnitude for the second erase pulse. First, a trial erase pulse is applied to the P-wells of the memory cells to be erased. Then, a first and a second read voltage are applied to word lines of the memory cells. After the first read voltage is applied, data from the read is sent to the controller 244. The controller 244 determines a first and a second count of NAND strings that have at least one memory cell with a Vt that is at least as high as the read voltages. Based on the counts, the controller 244 determines the magnitude for a second erase pulse. In this embodiment, the upper tail Vt is determined based on expected statistics of the erase threshold distribution. In one embodiment, the upper tail Vt is determined based on a modified Weibull function, as discussed below. Note that the second erase pulse is started prior to the controller 224 determining what the final magnitude of the second erase pulse should be. However, the timing is such that the controller 244 is able to provide the second erase voltage to circuitry on chip (e.g., state machine 222) in sufficient time to prevent the second erase pulse from ramping up too far.

Figure 12B:
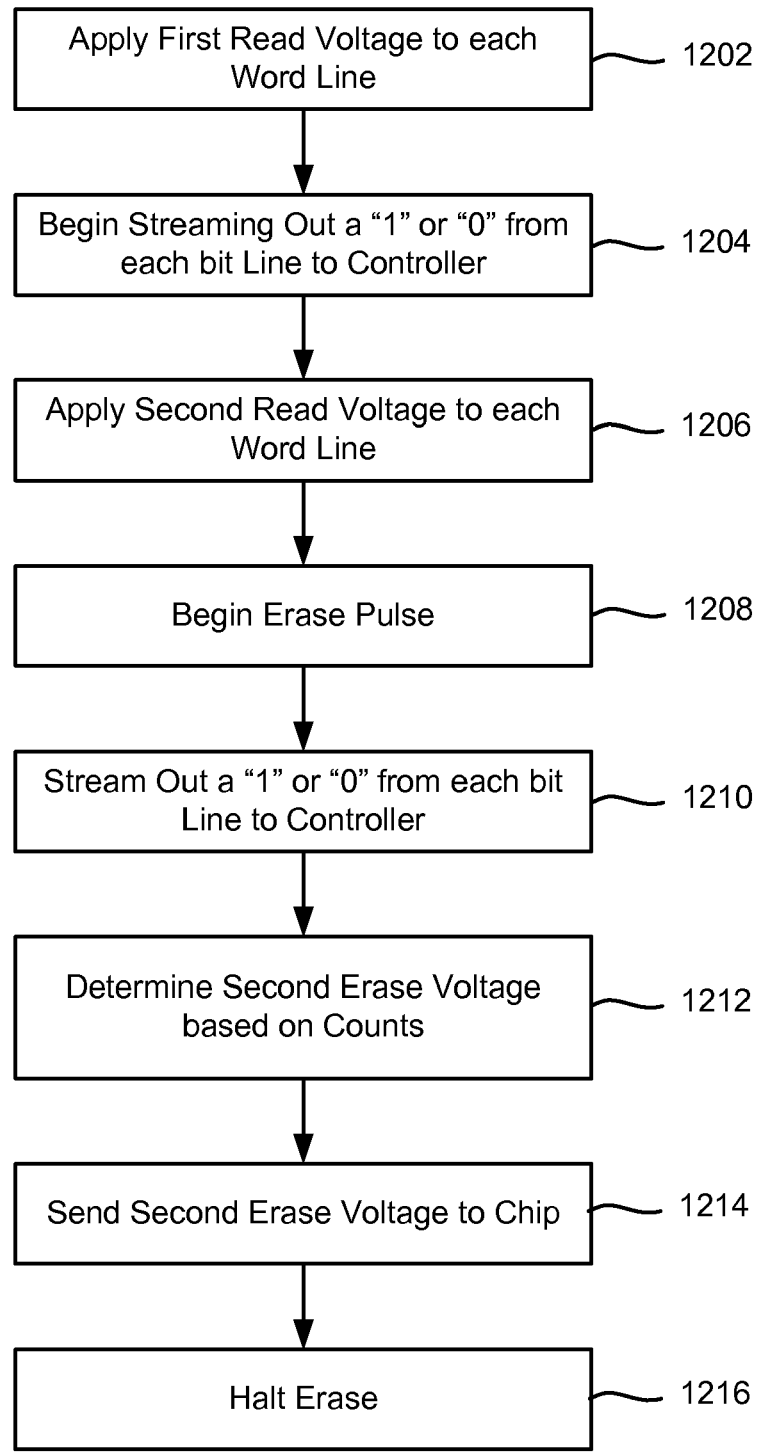
FIG. 12B depicts one embodiment of a process of applying read voltages to memory cells and determining a second erase voltage.

FIG. 12B depicts one embodiment of a process 1200 of applying read voltages to the memory cells and determining the second erase voltage. Process 1200 will be discussed with reference to FIG. 12A. In step 1202, a first read voltage is applied to word lines of the memory cells. Referring to FIG. 12A, the example first read voltage is 0 volts. The first read voltage may be applied simultaneously to each word line to determine whether each NAND string has at least one memory cell with a Vt above the read voltage. The results from reading the NAND strings are stored in a first set of data latches. In one implementation, the first read takes about 20 micro-seconds. Note that individual memory cells on a NAND string could be read, if desired.

In step 1204, results of the first read are started to be streamed out to the controller 244. In one embodiment, a "1" or a "0" is streamed from the memory die 212 to the controller 244 for up to each NAND string. However, it is not required that results for each NAND string be provided. For example, some memory devices have an extremely large number of NAND strings. In some implementations, there may be 75,000 NAND strings, or even more. The controller 244 does not require data from all of the NAND strings in order to perform an accurate determination of the second erase voltage. Thus, in one embodiment, data from a subset of the NAND strings is output.

In step 1206, a second read voltage is applied to the word lines of the memory cells. Note that the second read voltage may be applied prior to completion of step 1204 of sending the results of the first read to the controller 244. The results from the second read are stored in a second set of data latches. Referring to FIG. 12A, the length of time it takes to stream all of the data to the controller 244 may be relatively long compared to the time that is takes to perform the reads.

In step 1208, ramping up of the second erase pulse is started after the second read completes. It is not required to start the second erase pulse immediately after the second read completes. Note that the second erase pulse is started even prior to completion of sending the results of the first read to the controller 244. In one implementation, the state machine 222 causes the erase pulse to begin to ramp up towards a default voltage. The default voltage is selected such that it is not too high to over erase the memory cells. This erase pulse will be halted later in the process 1200. In one embodiment, the erase pulse has a controlled rise time to provide sufficient time for the second erase voltage to be determined. An example rise time is 1V/40 micro-seconds. Thus, it will take about 400 micro-seconds for the erase pulse to rise to 10 V.

In step 1210, results from applying the second read voltage are provided to the controller 244. As depicted in FIG. 12A, the results from the second read are not sent to the controller 244 until after the results from the first read have been completely sent. This sequence is for convenience and is not a requirement. As an alternative, the results from the second read can be sent to the controller 244 while the first results are still being sent.

In step 1212, the controller 244 determines the second erase voltage based on the data from the first and second reads. The controller 244 determines the second erase voltage based on expected statistical characteristics of the erase threshold distribution after the trial erase. In one embodiment, the controller 244 performs a table lookup to determine the second erase voltage. The table may be constructed based on tests performed on memory devices. In one embodiment, the controller 244 uses the read counts to solve for one or more unknowns in an equation (e.g., modified Weibull equation) that describes the shape of the erase distribution after the trial erase. After the unknowns in the modified Weibull are identified, the upper tail Vt is determined based on the modified Weibull equation.

In one implementation, tests are performed on memory devices to determine a mathematical model that will characterize the expected shape of at least the upper portion of the erase Vt distribution. Note that the mathematical model might not describe the shape of the entire distribution. In this present example, because the lower portion of the distribution is expected to be bumpy, the mathematical model might not describe the lower portion. However, the first and second readings are made at voltages for which the mathematical model is expected to be valid. As an example, the shape of the upper portion of the distribution might be expected to have a Gaussian distribution. The shape of the lower portion might not be Gaussian. Moreover, the lower portion might be difficult to model due to the bumpiness of the distribution. However, measurements are not performed on the portion for which the model is not expected to hold.

Note that the mathematical model may describe the entire shape of the erase distribution, not just the upper portion. One type of mathematical model that may be used to describe the entire shape of the erase distribution is a generalized extreme value distribution. One type of generalized extreme value distribution is a Weibull function. An equation for the cumulative distribution function (cdf) for a modified Weibull function is shown in Equation 4A below.

$$F(x, k, \lambda, a, b) = u(ax+b) * \left[1 - exp\left(-\left(\frac{ax+b}{\lambda}\right)^k\right)\right] \quad \text{Eq. 4A}$$

In the above modified Weibull equation, u is the unit step function, such that $u(x)=1$ for $x>0$, and is $u(x)=0$ for $x<0$. Thus, the modified Weibull cdf is zero for $ax+b<0$. The variable x is the word line voltage, in one embodiment. The variable x may also represent the threshold voltage, VT, of cells as measured from the word line. In Equation 4A, k is a shape parameter (for $k>0$), and $\lambda$ is a scale parameter (for $\lambda>0$). The variable "a" is also a scale parameter, and "b" is a shift parameter that shifts the distribution along the x-axis.

Suitable values for k and $\lambda$ may be determined by engineering characterization. To simplify the determination, the value for $\lambda$ may be set to 1 with no loss of generality. In this case, $\lambda$ does not impact the scale of the modified Weibull cdf. However, $\lambda$ can be given a value other than 1. The introduction of parameters "a" and "b" into the Weibull distribution make λ redundant, since any change in λ is equivalent to a change in a and b. For example, a=5, b=10, and λ=1 result in exactly the same distribution as a=2, b=20, and λ=2. Any change in λ can be worked into a pair of changes in a and b. Therefore, with no loss of generality Eq. 4A can be rewritten as:

$$F(x, k, a, b)=[1-\exp(-(ax+b)^k)] \text{ where } ax+b \geq 0 \quad \text{Eq. 4B}$$

The two read operations at read voltages $x_1$ and $x_2$ will produce normalized counts $F_1=F(x=x_1)$, and $F_2=F(x=x_2)$ that are obtained by dividing the number of cells that are detected to be on at word line voltages $x_1$ and $x_2$, respectively, by the total number of cells on a chosen word line of the block that is being erased. Then a and b can be found by using the following procedure:

$$F_1(x_1)=[1-\exp((-(ax_1+b)^k)] \; F_2(x_2)=[1-\exp((-(ax_2+b)^k)]$$

Rearranging the terms of the above equations:

$$\exp((-(ax_1+b)^k)=[1-F_1(x_1)] \; \exp((-(ax_2+b)^k)=[1-F_2(x_2)]$$

Taking natural logarithm of both sides:

$$((-(ax_1+b)^k)=\ln[1-F_1(x_1)] \; ((-(ax_2+b)^k)=\ln[1-F_2(x_2)]$$

Or:

$$(ax_1+b)^k=-\ln[1-F_1(x_1)] \; (ax_2+b)^k=-\ln[1-F_2(x_2)]$$

Taking natural logarithm of both sides again:

$$k \cdot \ln(ax_1+b)=-\ln[1-F_1(x_1)] \; k \cdot \ln(ax_2+b)=-\ln[1-F_2(x_2)]$$

Dividing both sides by k and taking the exponential of both sides:

$$(ax_1+b) = \ln\left[\frac{-\ln(1-F_1(x_1))}{k}\right] = c_1$$

$$(ax_2+b) = \ln\left[\frac{-\ln(1-F_2(x_2))}{k}\right] = c_2$$

Since $F_1=F(x=x_1)$, $F_2=F(x=x_2)$, and k are known, $c_1$ and $c_2$ are readily obtained using above expressions, and then "a" and "b" are obtained using the following two equations:

$$a = \frac{c_1-c_2}{x_1-x_2} \text{ and } b = c_2 - \frac{c_1-c_2}{x_1-x_2}x_2$$

Note that the above assumes a fixed value for k, which simplifies the calculations. The value of k is not necessarily a constant; however, based on engineering analysis a suitable constant for a given technology can be determined for k. The value for k may be characteristic of the memory device technology. For example, k may be a function of memory cell properties such as physical size and other physical properties. Thus, the value for k does not necessarily vary significantly among memory devices fabricated having the same memory array design. An example value for k is 4.6; however, k can have another value. A suitable value for k for a given memory array design may be determined experimentally. For example, threshold voltage distribution data is collected after erasing memory cells. Then, using Equation 4B as a fitting function, values for a, b, and k are solved for simultaneously to optimize the fit between the collected data and Equation 4B. The fitting may be performed based on sets of data using different erase voltages. Also, different data may be collected for different wordlines, as well as for memory cells that have undergone different numbers of program/erase cycles. Thus, the results produce multiple values for k. Then, based on the results, a constant is selected for k. After selecting a constant for k, its suitability may be verified by holding k constant and optimizing for only a and b when fitting Equation 4B to the collected data. If desired, another constant value can be selected for k and again only a and b are optimized using Equation 4B. The value of k which results in the lowest root mean square (RMS) error between the fitting function (Equation 4B) and the actual data may be used in the field.

The above fitting process will also produce values of "a" and "b" for each set of collected data. However, those values of "a" and "b" are not used in the field. Rather, values for "a" and "b" may be determined in the field based on data from the first and second reads as described above. For example, after an initial erase pulse, two reads are performed at two different read voltages. As an example, the reads are performed at $x_1=0$ V and $x_2=1$ V applied to the word lines of cells on a page of data belonging to the block that is being erased. For each read, a count is determined of the number of memory cells that turn on in response to the read. These counts, once normalized by dividing each measured count by the number of cells being read become $F_1=F(x=x_1)$, $F_2=F(x=x_2)$, and are used to determine "a" and "b" based on above formulas. In one embodiment, this computation is performed in real time. However, a table driven approach can be used.

Once values are determined for "a" and "b", the upper tail Vt can be determined directly from the modified Weibull function (using a suitable value for k). That is, the upper tail Vt is defined as being at a certain location on the upper end of the Weibull cdf. As discussed above, a suitable magnitude for the second erase pulse can be determined based on the magnitude of the trial erase pulse and the upper tail Vt.

Note that the ability to accurately solve for the unknowns (a and b) in the modified Weibull function will be affected by where on the erase distribution the two sample reads are taken. In one embodiment, the first and second reads are performed at read voltages that are expected to result in about 30 percent and 60 percent of the memory cells turning on, for the first and second read respectively. However, different percentages could be targeted. If one or both of the two reads have values that indicate a substantial difference from these targets, then one or more additional reads can be performed. For example, if the first and second read are at 0V and 1V, but both result in a small percentage of memory cells turning on, then one or more additional reads can be performed at higher read voltages.

If the reads did not occur at suitable locations on the erase distribution, another option is to perform a stronger erase pulse than the trial erase to push the erase distribution to a lower voltage distribution and then repeat the reads at the same (or different) voltages. Referring back to the embodiment depicted in FIG. 12A, because the second erase pulse is started prior to the controller receiving all of the data from the first and second reads, the controller calculation of the second erase voltage (that is the voltage at which to halt the erase pulse) is designed to shift the erase distribution such that better data can be collected for determining the upper tail Vt from the modified Weibull function. Then, the controller causes additional reads to be performed on the new erase distribution. Other types of generalized extreme value distributions than the modified Weibull function might also be used.

In one embodiment, the model that is developed has two unknowns. Values (M1, M2) that are based on data from the first and second reads are used to determine the two unknowns. As an example, the two unknowns could be the mean and standard deviation. Equations 5 and 6 having the following general form may be used to determine the unknowns based on M1 and M2.

$$\text{Mean} = F(M1, M2) \qquad \text{Eq. 5}$$

$$\text{Standard Deviation} = G(M1, M2) \qquad \text{Eq. 6}$$

Thus, based on information derived from the first and second reads, the two unknowns can be determined. From the mean and standard deviation, the upper tail Vt can be determined.

Note that it is not required that the controller 244 determine two unknowns, as in the example with the modified Weibull equation. For example, it might be expected that the standard deviation can be predicted without performing any readings. This prediction would be based on tests performed on memory devices and an assumption that the standard deviation will not differ significantly from one trial erase to the next. Also note that if such an assumption is made with respect to an unknown such as the standard deviation, then it may be possible to determine the upper tail Vt based on a single reading. Therefore, performing two readings is not a requirement.

Note that a second reading that indicates that too few NAND strings have at least one memory cell with a Vt above the second read voltage may indicate that the second reading was taken above the upper tail Vt. In one embodiment, if the second reading appears to have been taken above the upper tail Vt, then the second reading is ignored. Either a new reading can be taken at a lower voltage or the controller 244 can determine the second erase voltage based on a single reading.

It may be that the equations to determine the unknowns are fairly complex. Thus, rather than having the controller 244 solve for the unknowns, in one embodiment the controller 244 performs a table lookup. The table may be constructed by performing the above calculations for different combinations of M1 and M2. In one implementation, a table is constructed without deriving equations to solve for the unknowns. For example, the table can be constructed based on empirically collected data.

After determining the upper tail Vt, the controller 244 determines a suitable magnitude for the second erase voltage. Equations 1 and 2 above describe one technique for the controller to determine the second erase voltage. In step 1214, the controller 244 provides the final magnitude of the second erase voltage to the state machine 222. In one embodiment, the controller 244 provides a value to be input to a DAC that controls the magnitude of the erase pulse. In step 1216, the state machine 222 causes the erase pulse to be stopped at the magnitude of the second erase. In one implementation, the state machine 222 sends a command to the memory array to modify the erase pulse. In one embodiment, the controller 244 is on the same chip as the memory die 212. Thus, the communication of the read data to the controller 244 is on-chip.

Figure 13:
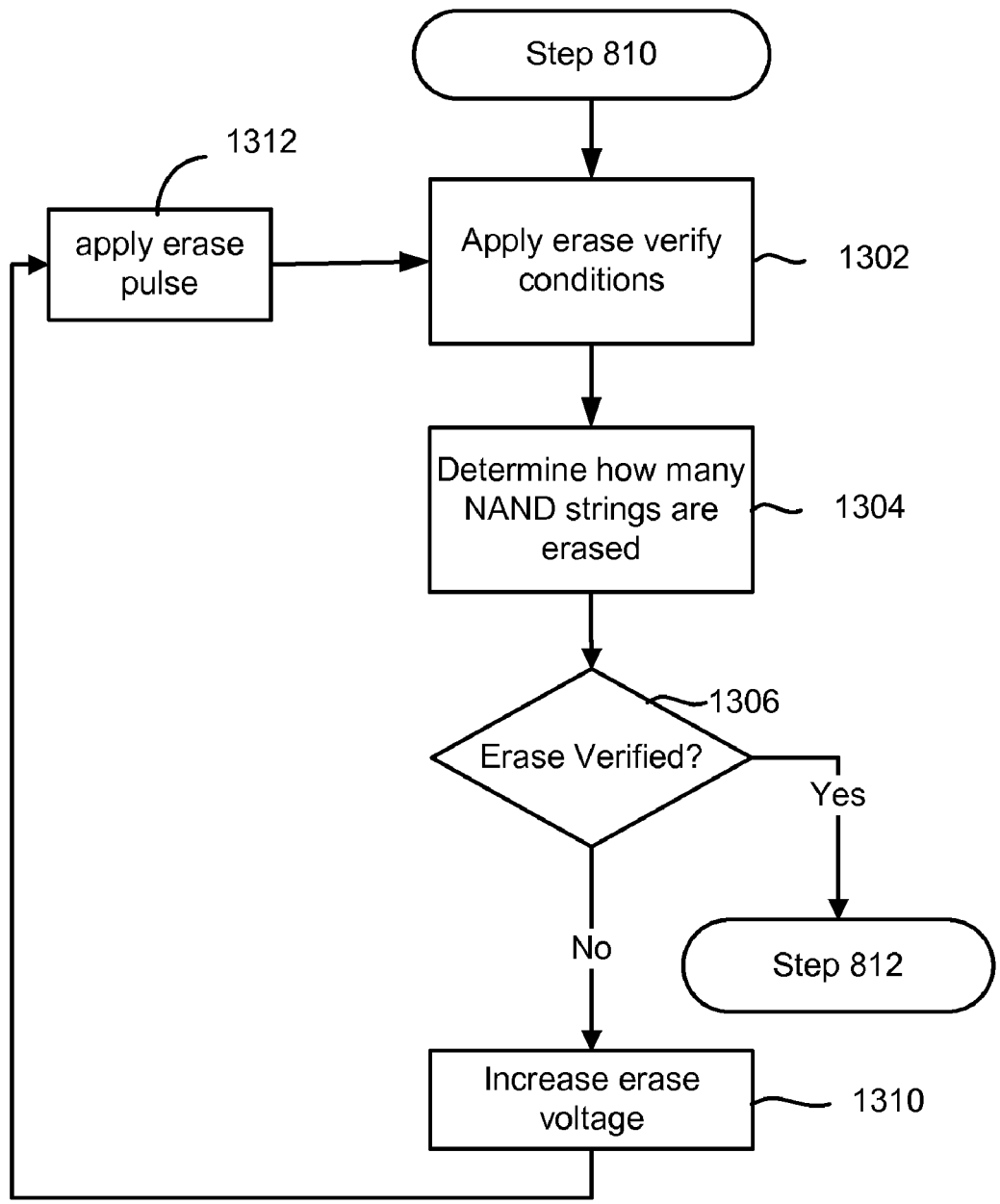
FIG. 13 is a flow chart describing a process for verifying that memory cells have been erased.

FIG. 13 is a flow chart describing a process 1300 for verifying that the memory cells have been erased. In one embodiment, the process 1300 of FIG. 13 is used between steps 810 and 812 of process 800. In step 1302, a set of erase verify conditions are applied to the memory cells. In one implementation, source follower sensing is employed. Step 1302 includes discharging bit lines to ground, which may be achieved by turning on the drain side select gate (SGD). Then, a higher than zero voltage (e.g., 2.2V) is applied to the common source line and a certain voltage (e.g., 0V) is applied to the word lines. Charge builds up on the bit line of a given NAND string until the body effect turns off at least one memory cell in the NAND string.

In step 1304, each of the NAND strings is sensed to determine whether all of the memory cells on the NAND string were sufficiently erased. Step 1304 is performed after waiting for a predetermined period of time for the charge to build up on the bit line. In one implementation, the voltage on a given bit line is compared to a reference value to determine whether any of the memory cells on the corresponding NAND string have a Vt that is above the target value. The target value could be a negative value. In some implementations, the memory cells are erased to as much as −3V.

In one embodiment, if it is detected that the Vt of each memory cell on a NAND string has reached the target level, then the data stored in the corresponding data latch is changed to a logic "1." If it is detected that the NAND string has at least one memory cell with a Vt that has not reached the appropriate target level, the data stored in the corresponding data latch is not changed.

In step 1306, a determination is made as to whether enough NAND strings passed erase verification. In one implementation, a certain number of NAND strings are allowed to fail erase verification. For example, providing that fewer than 32 NAND strings failed erase verification, the overall erase verification passes. If erase passed, then control passes to step 812.

If, at step 1306, it is determined that erase verification failed, then the erase voltage is increased in step 1310. The erase voltage can be increased by any desired amount such as 0.2 V, 0.5 V, 1.0 V, etc. The new erase voltage is applied in step 1312. Then, step 1302 is performed again. Note that erase verification can be performed without the source follower technique.

Figure 14:
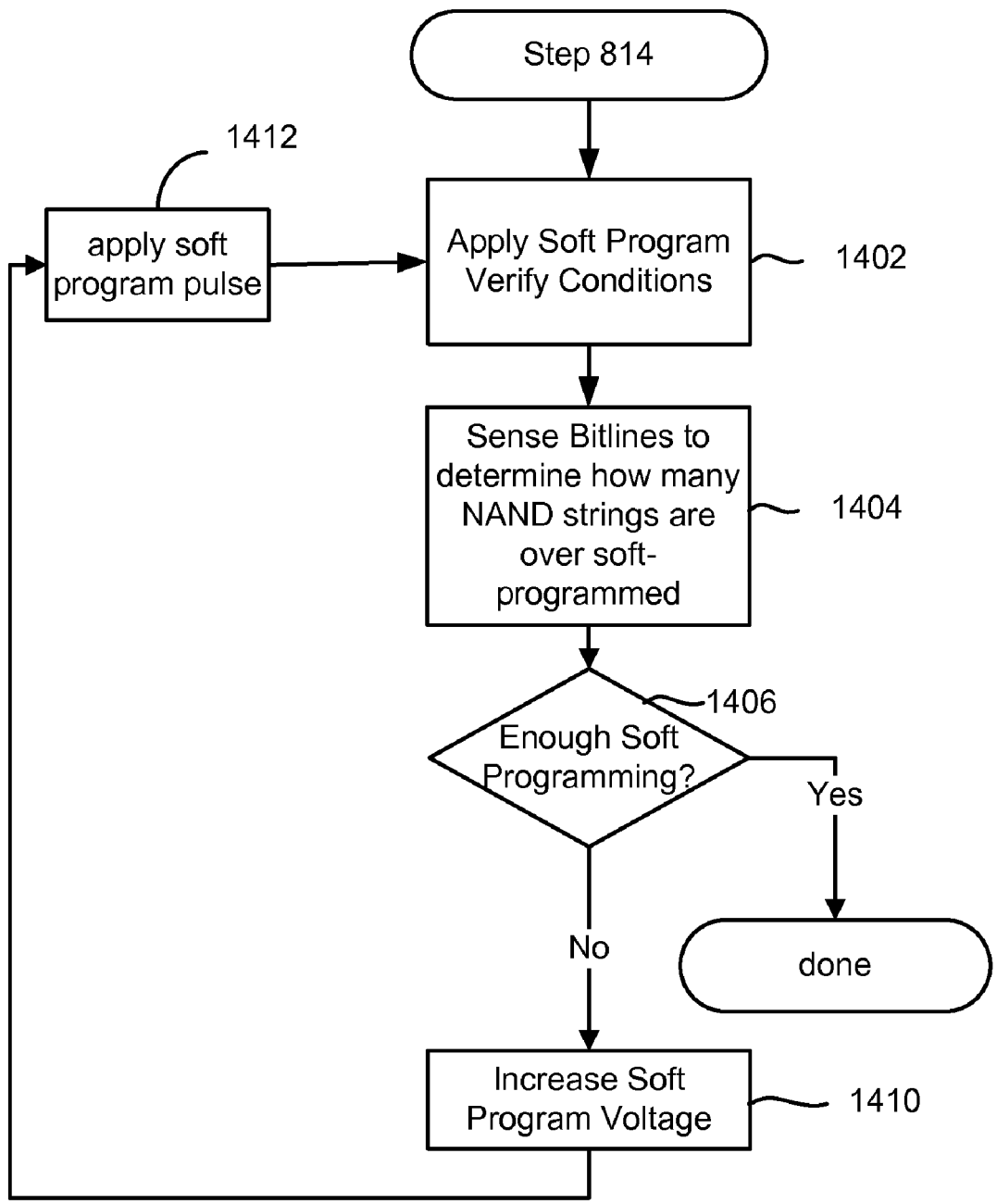
FIG. 14 is a flow chart describing a process for verifying the soft programming of memory cells.

FIG. 14 is a flow chart describing a process 1400 for verifying the soft programming of the memory cells. In one embodiment, the process 1400 of FIG. 14 is used after step 814 of process 800. In step 1402, a set of soft program verify conditions are applied to the memory cells. In one implementation, source following sensing is employed.

In step 1404, each of the NAND strings is sensed to determine how many NAND strings have a conduction current that is below a demarcation current. Having a low conduction current indicates that the NAND string has been over soft-programmed. As previously discussed, soft programming is intended to nudge the Vts of memory cells with the lowest Vts upwards without causing memory cells to be programmed to a Vt above a certain level. That level could be the erase target level. However, the level could be zero volts, in which case the source follower technique is not needed to verify negative Vts. Thus, one technique to verify whether soft programming should stop is to test how many NAND strings have at least one memory cell with a Vt above a certain level. Other techniques can be used to determine when to stop soft programming. Step 1404 is performed after waiting for a predetermined period of time for the charge to build up on the bit lines. In one implementation, the voltages on the bit lines are compared to a reference value to determine whether any of the NAND strings have been programmed too far.

In step 1406, a determination is made whether to stop soft programming based on the results of step 1404. For example, a determination is made as to how many NAND strings have a conduction current that is below a demarcation current. If too many NAND strings have a low conduction current, then soft programming should stop. If soft programming should stop, then the process 1400 finishes.

If, at step 1406, it is determined that further soft programming is desired, then the soft programming voltage is increased in step 1410. The soft programming voltage can be increased by any desired amount such as 0.1 V, 0.2 V, etc. The new soft programming voltage is applied in step 1412. Then, step 1402 is performed again.

The soft programming process 1400 was described as programming each NAND string in the block until the process completes. However, it is not required that each NAND string continue to receive programming throughout the process. In one embodiment, whenever a given NAND string has been sufficiently programmed, it is locked out from further programming.

The above examples are provided with respect to NAND type flash memory. However, the principles of the present invention have application to other types of non-volatile memories, including those currently existing and those contemplated to use new technology being developed.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for operating a non-volatile storage device, the method comprising:
   performing a first erase of a group of non-volatile storage elements using a first erase voltage, the non-volatile storage elements have a threshold voltage distribution as a result of the first erase;
   determining a reference voltage within the threshold voltage distribution, the reference voltage has a magnitude;
   determining a second erase voltage based on the first erase voltage and the magnitude of the reference voltage; and
   performing a second erase of the group of non-volatile storage elements using the second erase voltage.

2. The method of claim 1, further comprising:
   programming the group of non-volatile storage elements such that substantially all of the non-volatile storage elements have at least a certain threshold voltage, the programming is performed prior to performing the first erase.

3. The method of claim 1, wherein the group of non-volatile storage elements includes a plurality of NAND strings and wherein a certain number of the NAND strings are allowed to have at least one non-volatile storage element with a threshold voltage that is greater than the magnitude of the reference voltage and wherein the determining a reference voltage includes:
   determining a first voltage at which approximately the certain number of the NAND strings have at least one memory cell with a threshold voltage greater than the first voltage.

4. The method of claim 1, wherein the determining a reference voltage includes:
   applying a first voltage to control gates of the non-volatile storage elements;
   determining a first count that is based on how many of the non-volatile storage elements fail to turn on in response to the applying the first voltage;
   applying a second voltage to control gates of the non-volatile storage elements;
   determining a second count that is based on how many of the non-volatile storage elements fail to turn on in response to the applying the second voltage; and
   determining a voltage on an upper tail of the threshold voltage distribution based on the first count and the second count.

5. The method of claim 4, wherein the determining the reference voltage is based on expected statistical characteristics of the threshold voltage distribution after the first erase.

6. The method of claim 1, further comprising:
   determining a soft program voltage based on the second erase voltage; and
   applying the soft program voltage to the group of non-volatile storage elements after performing the second erase.

7. The method of claim 1, wherein the performing a second erase of the group of non-volatile storage elements using the second erase voltage includes:
   beginning to ramp up towards the second erase voltage prior to determining the second erase voltage.

8. The method of claim 1, wherein the first erase voltage is sufficiently low to cause at least a portion of the threshold voltage distribution to be within a measurable threshold voltage window after the first erase.

9. The method of claim 1, wherein the determining a second erase voltage is further based on how far the reference voltage is expected to shift per unit increase of magnitude of the first erase voltage.

10. A method for operating a non-volatile storage device, the method comprising:
    programming a plurality of NAND strings of non-volatile storage elements such that substantially all of the non-volatile storage elements have at least a certain threshold voltage;
    erasing the plurality of NAND strings of non-volatile storage elements using a first erase voltage;
    determining a voltage on an upper tail of a threshold voltage distribution of the plurality of NAND strings of non-volatile storage elements after erasing using the first erase voltage;
    determining a second erase voltage based on the first erase voltage and the voltage on the upper tail; and
    erasing the plurality of NAND strings of non-volatile storage elements using the second erase voltage.

11. The method of claim 10, wherein the determining a voltage on the upper tail includes:
    applying a plurality of read voltages to control gates of the NAND strings of non-volatile storage elements, the plurality of read voltages are different from each other;
    storing, for each of the read voltages, a count that is based on how many of the NAND strings have at least one non-volatile storage element that fails to turn on in response to applying one of the read voltages, each count is associated with one of the read voltages;
    selecting one or more of the counts based on how many of the NAND strings of non-volatile storage elements are allowed to have at least one non-volatile storage element with a threshold voltage that is greater than the voltage on the upper tail; and
    determining the voltage on the upper tail based on the read voltages associated with the selected counts.

12. The method of claim 11, wherein the storing the count for a particular read voltage of the read voltages includes:
    ignoring whether any additional ones of the NAND strings have at least one non-volatile storage element that fails to turn on in response to applying the particular read voltage once the count associated with the particular read voltage exceeds a certain value.

13. The method of claim 10, wherein the determining a voltage on the upper tail includes:
applying a first read voltage to control gates of the plurality of NAND strings of non-volatile storage elements;
sensing first signals on a set of the plurality of NAND strings, the sensing is in response to the applying a first read voltage;
applying a second read voltage to the control gates of the NAND strings of non-volatile storage elements, the second read voltage is different from the first read voltage;
sensing second signals on the set of NAND strings in response to the applying a second read voltage; and
determining the voltage on the upper tail based on the first signals, the second signals, and expected statistical characteristics of the threshold voltage distribution after the first erase.

14. The method of claim 10, wherein the threshold voltage distribution after the first erase is a first threshold voltage distribution and the plurality of NAND strings of non-volatile storage elements have a second threshold voltage distribution after the second erase and further comprising:
determining a program voltage based on the second erase voltage; and
compressing the second threshold voltage distribution by applying the program voltage to control gates of the NAND strings of non-volatile storage elements after performing the second erase.

15. A method for operating a non-volatile storage device, the method comprising:
pre-conditioning a group of non-volatile storage elements to facilitate determining a threshold voltage associated with an upper tail of an erase threshold distribution that the group of non-volatile storage elements will have after erasing the group of non-volatile storage elements;
erasing the group of non-volatile storage elements to the erase threshold distribution having the upper tail, the erasing performed using a first erase voltage after the programming;
determining the threshold voltage associated with the upper tail of the erase threshold distribution;
determining a second erase voltage based on the first erase voltage and the threshold voltage associated with the upper tail; and
erasing the group of non-volatile storage elements using the second erase voltage.

16. The method of claim 15, wherein the pre-conditioning a group of non-volatile storage elements includes:
applying a programming voltage to each of the non-volatile storage elements simultaneously to cause substantially all of the non-volatile storage elements to have at least a certain threshold voltage, the certain threshold voltage is greater than voltages that are applied to the non-volatile storage elements to determine the threshold voltage associated with the upper tail of the erase threshold distribution.

17. The method of claim 15, wherein the pre-conditioning facilitates precise measurement of the threshold voltage associated with on the upper tail of the erase threshold distribution.

18. The method of claim 15, wherein the threshold voltage associated with the upper tail of the erase threshold distribution is within a measurable voltage threshold window.

19. The method of claim 15, wherein the determining the threshold voltage associated with the upper tail of the erase threshold distribution includes:
determining a first count that is based on how many of the non-volatile storage elements fail to turn on in response to a first read voltage;
determining a second count that is based on how many of the non-volatile storage elements fail to turn on in response to a second read voltage; and
extrapolating from the first count and the second count to determine the threshold voltage associated with the upper tail of the erase threshold distribution.

20. The method of claim 15, wherein the determining a second erase voltage is further based on how much shift is expected to the threshold voltage associated with the upper tail of the erase threshold distribution per unit increase in magnitude of the first erase voltage.

21. The method of claim 20, further comprising dynamically determining a parameter that characterizes how much shift is expected to the threshold voltage associated with the upper tail of the erase threshold distribution per unit increase in magnitude of the first erase voltage.

22. A non-volatile storage device comprising:
a plurality of NAND strings of non-volatile storage elements; and
one or more managing circuits in communication with the plurality of NAND strings, the one or more managing circuits program the plurality of NAND strings of non-volatile storage elements such that substantially all of the non-volatile storage elements have at least a certain threshold voltage, the one or more managing circuits erase the plurality of NAND strings of non-volatile storage elements using a first erase voltage, the one or more managing circuits determine a voltage on an upper tail of a threshold voltage distribution of the plurality of NAND strings of non-volatile storage elements after erasing using the first erase voltage, the one or more managing circuits determine a second erase voltage based on the first erase voltage and the voltage on the upper tail, the one or more managing circuits erase the plurality of NAND strings of non-volatile storage elements using the second erase voltage.

23. The non-volatile storage device of claim 22, wherein the one or more managing circuits apply a plurality of different read voltages to control gates of the NAND strings of non-volatile storage elements, the one or more managing circuits store a count for each of the read voltages that is based on how many of the NAND strings of non-volatile storage elements have at least one element that fails to turn on in response to applying one of the read voltages, the one or more managing circuits select one or more of the counts based on how many of the NAND strings of non-volatile storage elements are allowed to have at least one non-volatile storage elements with a threshold voltage that is greater than the voltage on the upper tail, the one or more managing circuits determine the voltage on the upper tail based on the read voltages associated with the selected counts.

24. The non-volatile storage device of claim 23, wherein the one or more managing circuits apply a first read voltage to control gates of the plurality of NAND strings of non-volatile storage elements, the one or more managing circuits sense first signals on a set of the plurality of NAND strings in response to the applying a first read voltage, the one or more managing circuits apply a second read voltage that is different from the first read voltage to the control gates of the NAND strings of non-volatile storage elements, the one or more managing circuits sense second signals on the set of NAND strings in response to the applying a second read voltage, the one or more managing circuits determine the voltage on the upper tail based on the first signals, the second signals, and expected statistical characteristics of the threshold voltage distribution after the first erase.

25. The non-volatile storage device of claim 22, wherein the threshold voltage distribution after the first erase is a first threshold voltage distribution and the plurality of NAND strings of non-volatile storage elements have a second threshold voltage distribution after the second erase and wherein the one or more managing circuits determine a program voltage based on the second erase voltage, the one or more managing circuits compress the second threshold voltage distribution by applying the program voltage to control gates of the NAND strings of non-volatile storage elements after performing the second erase.

26. A non-volatile storage device comprising:
a plurality of NAND strings of non-volatile storage elements; and
one or more managing circuits in communication with the plurality of NAND strings, the one or more managing circuits pre-condition a group of non-volatile storage elements to facilitate determining a threshold voltage associated with an upper tail of an erase threshold distribution that the group of non-volatile storage elements will have after erasing the group of non-volatile storage elements, the one or more managing circuits erase the group of non-volatile storage elements to the erase threshold distribution having the upper tail, the erasing performed using a first erase voltage after the programming, the one or more managing circuits determine the threshold voltage associated with the upper tail of the erase threshold distribution, the one or more managing circuits determine a second erase voltage based on the first erase voltage and the threshold voltage associated with the upper tail, and the one or more managing circuits erase the group of non-volatile storage elements using the second erase voltage.

27. The non-volatile storage device of claim 26, wherein to pre-condition a group of non-volatile storage elements the one or more managing circuits apply a programming voltage to each of the non-volatile storage elements simultaneously to cause substantially all of the non-volatile storage elements to have at least a certain threshold voltage, the certain threshold voltage is greater than voltages that are applied to the non-volatile storage elements to determine the threshold voltage associated with the upper tail of the erase threshold distribution.

28. The non-volatile storage device of claim 26, wherein to determine the threshold voltage associated with the upper tail of the erase threshold distribution: the one or more managing circuits determine a first count that is based on how many of the non-volatile storage elements fail to turn on in response to a first read voltage; the one or more managing circuits determine a second count that is based on how many of the non-volatile storage elements fail to turn on in response to a second read voltage; and the one or more managing circuits extrapolate from the first count and the second count to determine the threshold voltage associated with the upper tail of the erase threshold distribution.

29. The non-volatile storage device of claim 26, wherein the one or more managing circuits dynamically determine a parameter that characterizes how much shift is expected to the threshold voltage associated with the upper tail of the erase threshold distribution per unit increase in magnitude of the first erase voltage.

* * * * *